United States Patent [19]
Brown et al.

[11] Patent Number: 5,264,724
[45] Date of Patent: Nov. 23, 1993

[54] SILICON NITRIDE FOR APPLICATION AS THE GATE DIELECTRIC IN MOS DEVICES

[75] Inventors: William D. Brown, Fayetteville, Ark.; Muhammad A. Khaliq, Mankato, Minn.

[73] Assignee: The University of Arkansas, Little Rock, Ark.

[21] Appl. No.: 529,477

[22] Filed: May 29, 1990

Related U.S. Application Data

[60] Division of Ser. No. 478,028, Feb. 9, 1990, Pat. No. 4,962,065, which is a continuation of Ser. No. 309,113, Feb. 13, 1989, abandoned.

[51] Int. Cl.$^5$ .................. H01L 23/58; H01L 27/01; H01L 29/76; H01L 29/94
[52] U.S. Cl. .................... 257/347; 257/410; 257/314; 257/649; 437/184; 437/173; 437/225; 437/235; 427/164; 427/574; 427/579
[58] Field of Search ............... 357/23.7, 23.14, 23.15, 357/23.5, 41, 42, 51, 52; 437/184, 173, 225, 235; 427/53.1, 164; 257/649, 347, 410, 314

[56] References Cited

U.S. PATENT DOCUMENTS

| | | | |
|---|---|---|---|
| 3,652,324 | 3/1972 | Chu et al. | 357/23.14 |
| 3,805,130 | 4/1974 | Yamazaki | 357/23.5 |
| 3,856,587 | 12/1974 | Yamazaki et al. | 357/23.5 |
| 4,229,232 | 10/1980 | Kirkpatrick | 437/174 |
| 4,277,320 | 7/1981 | Beguwala et al. | 204/164 |
| 4,331,709 | 5/1982 | Risch et al. | 437/241 |
| 4,406,053 | 9/1983 | Takasaki et al. | 357/52 |

(List continued on next page.)

FOREIGN PATENT DOCUMENTS

| | | | |
|---|---|---|---|
| 0269008 | 6/1988 | European Pat. Off. | |
| 55-22863 | 2/1980 | Japan . | |
| 55-110037 | 8/1980 | Japan . | |
| 57-153429 | 9/1982 | Japan . | |
| 57-169248 | 10/1982 | Japan | 357/52 |
| 58-31536 | 2/1983 | Japan . | |
| 59-163871 | 9/1984 | Japan | 357/23.7 |
| 60-12737 | 1/1985 | Japan . | |
| 62-172732 | 7/1987 | Japan | 357/23.7 |
| 1-140653 | 6/1989 | Japan | 357/51 |
| 2056174 | 8/1980 | United Kingdom . | |

OTHER PUBLICATIONS

"Direct measurement of evaporation during rapid thermal processing of capped GaAs", T. E. Haynes and W. K. Chu, and S. T. Picraux, Appl. Phys. Lett., vol. 50, No. 16, Apr. 20, 1987.

"Comparison of the Interfacial Stress Resistance in Rapid Thermally Processed Thin Dielectrics", R. B. Calligaro et al. Elsevier Science Publishers B.V. (North-Holland), 1988, pp. 221-224.

"Excellent Charge-Trapping Properties of Ultrathin Reoxidized Nitrided Oxides Prepared by Rapid Thermal Processing", Takashi Hori and Hiroshi Iwasaki, IEEE Electron Device Letters, vol. 8, No. 4, Apr. 1988.

"Rapid Thermal Annealing of Si Implanted GaAs", W. M. Paulson, R. N. Legge, and C. E. Weitzel, Journal of Electronic Materials, vol. 16, No. 3, 1987, pp. 187-193.

"Rapid Thermal Annealing of Implanted Layers in Silicon Nitride Encapsulated Gallium Arsenide", M. R. Wilson et al., J. Electrochem. Soc.: Solid-State Science and Technology, vol. 134, No. 10, Oct. 1987, pp. 2560-2565.

"Room Temperature Deposition of Silicon Nitride Films Using Very Low Frequency (50 Hz) Plasma CVD", M. Shimozuma et al., Journal of Electronic Materials, vol. 14, No. 4, 1985, pp. 573-586.

"Plasma Deposited Silicon Nitride for Indium Phosphide Encapsulation", G. J. Valco et al., Electrochem. Soc., vol. 136, No. 1, Jan. 1989, pp. 175-182.

"Materials Issues In Silicon Integrated Circuit Processing", Mat. Res. Soc. Symp. Proc., vol. 71, 1986, Materi- (List continued on next page.)

Primary Examiner—William Mintel
Assistant Examiner—Steven Loke
Attorney, Agent, or Firm—Ivester Ivester

[57] ABSTRACT

A thin film layer of silicon nitride is deposited on silicon substrate by plasma enhanced chemical vapor deposition techniques is stabilized by post-deposition rapid thermal annealing at temperatures ranging from about 600° C. to about 700° C. and at times ranging from about 3 seconds to about 30 seconds.

5 Claims, 26 Drawing Sheets

U.S. PATENT DOCUMENTS

| | | | |
|---|---|---|---|
| 4,566,913 | 1/1986 | Brodsky et al. | 437/247 |
| 4,585,492 | 4/1986 | Weinberg et al. | 437/247 |
| 4,611,308 | 9/1986 | Lonky | 357/41 |
| 4,636,400 | 1/1987 | Nishioka et al. | 437/241 |
| 4,692,344 | 9/1987 | Kaganowicz et al. | 437/241 |
| 4,776,925 | 10/1988 | Fossum et al. | 437/242 |
| 4,784,964 | 11/1988 | Hulseweh et al. | 437/247 |
| 4,784,975 | 11/1988 | Hofmann et al. | 437/247 |
| 4,863,755 | 9/1989 | Hess et al. | 437/225 |
| 4,898,839 | 2/1990 | Fujinuma et al. | 357/51 |
| 4,962,065 | 10/1990 | Brown et al. | 437/94 |

OTHER PUBLICATIONS als Research Society, Marc Wittmer, James Stimmel, Michael Strathman, editors, pp. 441–447 and 449–454.

"Rapid thermal annealing of indium phosphide compound semiconductors", M. D. Beidenbender et al., J. Vac. Sci. Technol. A, vol. 5, No. 4, Jul./Aug. 1987, pp. 1437–1441.

"Insulating Films on Semiconductors", Insulating Films on Semiconductors, J. F. Verwei; & D. R. Wolters (Editors). Elsevier Science Publishers B.V. (North-Holland), 1983, pp. 116–121 and 224–229.

SILICON NITRIDE FOR APPLICATION AS THE GATE DIELECTRIC IN MOS DEVICES

This is a continuation, of application Ser. No. 478,028, filed Feb. 9, 1990, now U.S. Pat. No. 4,962,065, which is a continuation of application Ser. No. 309,113, filed Feb. 13, 1989, now abandoned.

BACKGROUND OF THE INVENTION

The present invention is directed generally to semiconductor devices. More specifically, the invention is directed to gate dielectrics. Yet more specifically, the invention is directed to the use of silicon nitride ($SiN_3$) as a gate dielectric.

The use of $SiN_3$ as a gate dielectric in a metal-oxide-silicon (MOS) device is highly desireable because of certain characteristics of the $SiN_3$ layer, namely its higher dielectric constant (as compared to that of silicon dioxide), its imperviousness to water vapor and ion diffusion, and radiation shielding. As a consequence, the use of $SiN_3$ as a gate dielectric in a MOS device has been pursued over the past 25 years or so.

However, in thin film form films of $SiN_3$ having a thickness of less than about 1000 angstroms, $SiN_3$ is generally unstable due to charge injection from the silicon into the nitride upon application of a voltage across an electrode formed on the $SiN_3$ film and a silicon substrate upon which the film was deposited. The charged is trapped in the nitride and this results in a shifting of the threshold voltage of the metal-nitride-silicon (MNS) structure. By reversing the polarity of the applied voltage the charge can be transferred from the nitride to the silicon with a resulting converse shift of the threshold voltage in the opposite direction. The MNS structure, because of this phenomenon, is a variable threshold field effect device. The device is also known as a metal-nitride-oxide-semiconductor (MNOS) nonvolatile memory device. The phenomenon of the reversing thresholds thus is a bysteresis effect.

The hysteresis effect was discovered circa 1967 by H.A.R. Wagener of Sperry Corporation. This discovery led to the development of MNOS devices and the nonvolatile semi-conductor memory technology supported heavily by the United States military.

Until now, the only way known to eliminate the hysteresis in MNOS structures was to grow a sufficiently thicker, i.e., greater then about 1000 angstroms, layer of oxide between the nitride and the silicon substrate. But, such a structure has the disadvantage of an oxide layer which is sensitive to radiation and effectively neutralizes the advantages of the high dielectric constant of the silicon nitride.

The earliest MNOS memory devices were fabricated using silicon nitride deposited by means of atmospheric pressure chemical vapor deposition (APCVD). Accordingly, most published data on MNOS devices concerns APCVD silicon nitride. However, most silicon nitride depositions are currently performed by means of low pressure chemical vapor deposition (LPCVD) systems because LPCVD films are more uniform in thickness, are more nearly stoichiometric, contain less hydrogen, and contamination by oxygen is less common.

Since both of these deposition methods are performed at high temperatures, i.e., at temperatures greater than about 700° C., there are difficulties in processing of radiation-tolerant peripheral MOS circuits. But, recent studies have suggested that by depositing silicon nitride by means of plasma-enhanced chemical vapor deposition (PECVD), a low temperature deposition, i.e., temperatures below about 400° C., can be successfully used in a MOS structure. Studies have shown a strong dependence of some electrical properties of these PECVD films on deposition parameters, and have concluded that properties of PECVD silicon nitride which are important for nonvolatile memory device operations, are comparable to those of high temperature CVD silicon nitride. This result is not surprising in view of published reports of results for PECVD silicon dioxide and suggestions that low temperature epitaxy may be realizable.

Charge trapping and transfer properties of silicon nitride used in MNOS non-volatile memory devices are thought to be associated with excess silicon and hydrogen in the silicon nitride film. It has been shown that charge transfer in LPCVD silicon nitride films increases with excess silicon. A further increase has been produced by removing hydrogen by beating the device above the deposition temperature. Hydrogen implantations followed by annealing at about 500° C. or rehydrogenation of annealed films in hydrogen plasma decreases the charge transfer and enhances charge trapping and retention due to the formation of Si—H bonds. In one study, it was demonstrated that Si-H bond density, which can be varied by controlling deposition parameters, has a significant impact on the physical and memory performance of "as deposited" PECVD silicon nitride.

Conventional post-deposition furnace annealing above about 500° C. of the films results in a severe loss of hydrogen and affects the physical and memory properties of the films. However, reported results for PECVD nitride suggest that for annealing temperatures of less than about 500°0C., hydrogen can transfer from nitrogen to silicon and annealing of disorder in the films is possible. It has also been demonstrated that memory properties of MNOS capacitors can be enhanced by annealing at temperatures up to 500°0C. with the most significant improvement occurring for about 30 minutes at 475°0C.

Recently, rapid thermal processing (RTP) has received much attention as a tool for activating implants, growing thin insulated films, nitridation, and annealing of encapsulant films and gate dielectrics. RTP offers advantages over conventional furnace annealing, the most notable advantage being precision in controlling of annealing time and temperature for short thermal cycles. Consequently, RTP permits slow out-diffusion and/or redistribution of hydrogen during the annealing of silicon nitride. As noted previously, hydrogen plays an extremely important role in silicon nitride used as the trapping layer in an MNOS memory device.

SUMMARY OF THE INVENTION

The present invention provides a MOS device having a stabilized thin film of silicon nitride as a gate dielectric and a process for producing same. To this end a MOS device is produced wherein a thin film of silicon nitride is deposited on a substrate by plasma-enhanced chemical vapor deposition and then stabilized by post-deposition rapid thermal annealing. The annealing is carried out at temperatures from about 600 °C. to about 700° C. and at times from about 3 seconds to about 30 seconds. The thin films produced have thicknesses of less than about 1000 angstroms. The resulting silicon nitride layer bas a higher dielectric constant than a comparable film of silicon dioxide, is impervious to water vapor and ion diffusion, and is radiation hard. Accordingly, the invention provides a stabilized thin film layer of silicon nitride for MOS devices without the need for an intervening layer of silicon oxide between the silicon substrate and the silicon nitride layer, although a thin layer of less than 20 angstroms of silicon-dioxide is present due to surface oxidation of the silicon substrate during the process.

DETAILED DESCRIPTION OF THE PRESENTLY PREFERRED EMBODIMENTS

Figure 1:
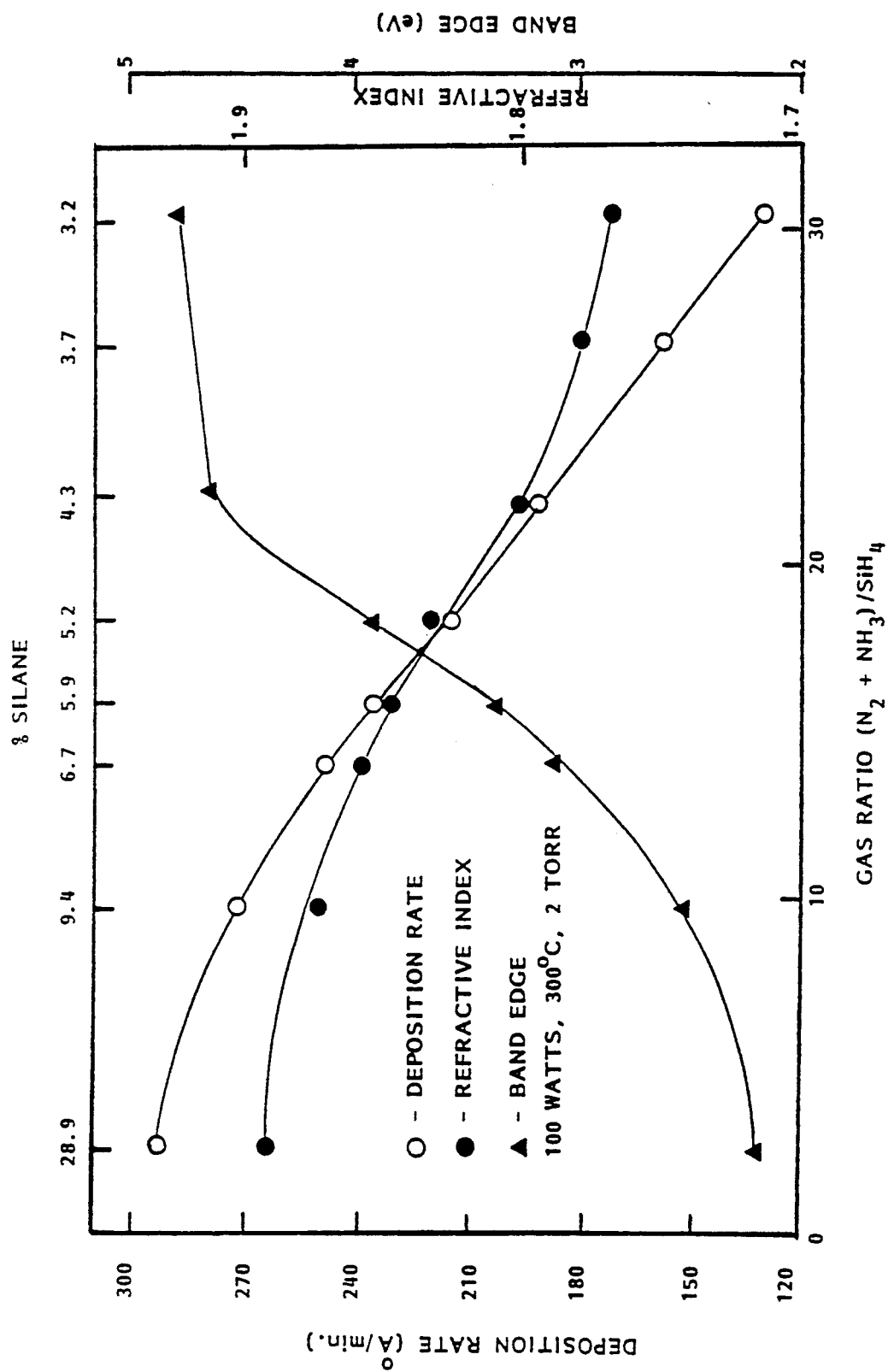
FIG. 1 illustrates deposition rate, refractive index, and band edge as a function of the gas ratio of $(N_2+NH_3)$ to $SiH_4$.

The present invention evolved from a series of experiments directed to the use of PECVD silicon nitride (SiN$_3$) as a trapping medium in nonvolatile memory devices. Initial efforts were directed at obtaining and defining optimal deposition parameters. Subsequent efforts were directed to obtaining and defining post-deposition annealing and implantation/annealing parameters that provided enhanced memory characteristics of MNOS devices. Electrical and physical properties of the films as a function of deposition properties and subsequent processing were studied to determine the relationship of the deposition properties and subsequent processing to charge transfer, trapping, and loss in the devices.

PROCEDURE

The test structured used to evaluate the memory performance of PECVD silicon nitride by means of ellipsometry was the MNOS capacitor. The substrate material employed was <111> oriented, 3-5,ohm-cm, n-type silicon. The substrate material was supplied by Monsato Corporation.

Prior to deposition of silicon nitride in the substrates, the substrates were cleaned using a hydrogen peroxide-sulfuric acid mixture, etched hydrophobic with hydrofluoric acid, rinsed with dioxizedwater, and then spin dried. The same substrate material was used for ellipsometry and auger analysis.

Optically polished, high resistivity silicon, diced into 5 mm by 5 mm samples, was used as the substrate material for Fourier Transform Infrared (FTIR) spectroscopic analysis. The FTIR samples were etched in buffered oxide etch, rinsed in dioxized water, and then blown dry with nitrogen prior to deposition. Commercially available, high quality, quartz plates of 1 mm thickness were used to determine the absorption band edge of silicon nitride using ultraviolet (UV) spectroscopic analysis. The quartz plates were supplied by Heraeus Amersil (T20 Superasil 2). Before deposition, the quartz plates were degreased in trichloroethylene, dipped in methanol, ultrasonically scrubbed, and then blown dry using nitrogen.

The deposition of silicon nitride was performed in a parallel-plate, capacitively coupled, 13.56 MHz, Reinberg-type reactor (Texas Instruments Model A-24C). The reactor was equipped with automatic power sensing and tuning circuits to maintain a constant power level during deposition. Deposition power, temperature, and chamber pressure were selected to maintain a stable plasma, to ensure reproducible film composition and thickness, and, most importantly, to yield the largest memory window for a 1 microsecond pulse and a $5 \times 10^6$ V/cm programming field. These requirements were met at a power of 100 watts (34 mw/cm$^2$), a substrate temperature of 300° C., and a chamber pressure of 2 Torr. Gas flow into the reaction chamber was controlled by mass flow controllers (Unit Instruments Model URS 100).

Silicon nitride films of various compositions were deposited by varying both the source and amount of nitrogen in the reactant gas streams. The gases used for deposition were: 5% silane in argon, anhydrous ammonia, and ultrahigh purity nitrogen (99.998% pure). The source and amount of nitrogen in the reactant gas stream was varied by varying the flow of nitrogen, ammonia, and silane so that the gas ratio of $(N_2+NH_3)$ to $SiH_4$ varied from 2.5 to 30.3. An ammonia to silane ratio of 0.8 was chosen because it consistently yielded the largest memory window in the work performed to determine optimal values for depositions power, temperature, and pressure. The flow of nitrogen was generally 750 sccm.

Following silicon nitride deposition, annealing and implantation/annealing steps were performed, followed by electrode formation using aluminum for the gate and gold for the backside ohmic contact. The deposited films were annealed in a nitrogen atmosphere using an AG Associates heart pulser Model 210T at temperatures from 400°0C. to 800° C. for times that ranged from 1 second to 180 seconds.

Film thicknesses and refractive oxides for "as deposited" and "annealed" material were determined using an Applied Materials Ellipsometer-II ellipsometer which uses an He—Ne laser with a wavelength of 6328 angstroms. Chemical bonding in the films was determined using a Nicolet 20-DX FTIR spectrometer with a resolution of 4 cm$^{31\ 1}$. Ten scans were taken and averaged for each spectrum.

Film thickness was approximately 5000 angstroms. The spectrum for bare silicon was subtracted from the spectrum for the nitride/substrate and the difference spectrum was analyzed using the method set forth by W. A. Landford and M. S. Rand at 49 J. Appl. Phys. 2473 (1978).

The band edges of the films were determined using a Varian Model Cary-210 spectrophotometer. Film thickness was approximately 5000 angstroms, deposited on quartz plates. The band edges were scanned over the wavelength range of 180 nm to 420 nm. The edges of the films were calculated using the method of Tauc as set forth in the book, *Optical Properties of Solids*, F. Abeles, ed., 279, North Holland Publications, Amsterdam, Holland (1972).

Memory characteristics were studied using the high frequency capacitance-voltage (C-V) curves of MNOS capacitors. The gate electrodes of the capacitors were formed from aluminum using shadow masks via thermal evaporation. The backside ohmic contacts were thermally evaporated gold. A light source was used to ensure sufficient minority carrier availability during write/erase operations using short programming pulse widths, and read disturb was minimized by closely controlling the amount of time that voltage was applied to the device under test. Resistivity and current-voltage (I-V) characteristics of the films were measured with a Hewlett Packard semiconductor parameter analyzer (Model HP4145A) using a staircase voltage ramp.

PECVD silicon nitride films were deposited using parameters described in the previous section, resulting in material that was slightly silicon rich (i.e., Si/N was about 0.85), contained a large concentration of bonded hydrogen (greater than 40% atomic weight) and, when used in an MNOS structure, yielded devices with memory characteristics comparable to those fabricated using atmospheric and low-pressure chemical vapor deposition. The films were then subjected to rapid thermal anneal cycles in nitrogen for times ranging from 1 to 180 seconds and temperatures from 4000° C. to 800° C. Anneals at 800° C. caused the films to rupture. This effect has been described previously in the literature and has been attributed to hydrogen release and accumulation of molecular hydrogen at the $Si/SiN_3$ interface. Altbough hydrogen is evolved by annealing at 400° C. and changes in both physical and memory properties of the material are observed, the results presented here are for annealing at 500° C., 600° C. and 700° C., the results at 400° C. and 500° C. being similar.

The electrical and physical properties of silicon nitride thin films are known to be sensitive functions of deposition conditions as noted previously. It follows then, that the memory performance of nonvolatile memory devices which utilize silicon nitride as the charge trapping medium is influenced by the deposition and post-deposition processing of the nitride.

37 As-deposited" PECVD Silicon Nitride

Figure 2:
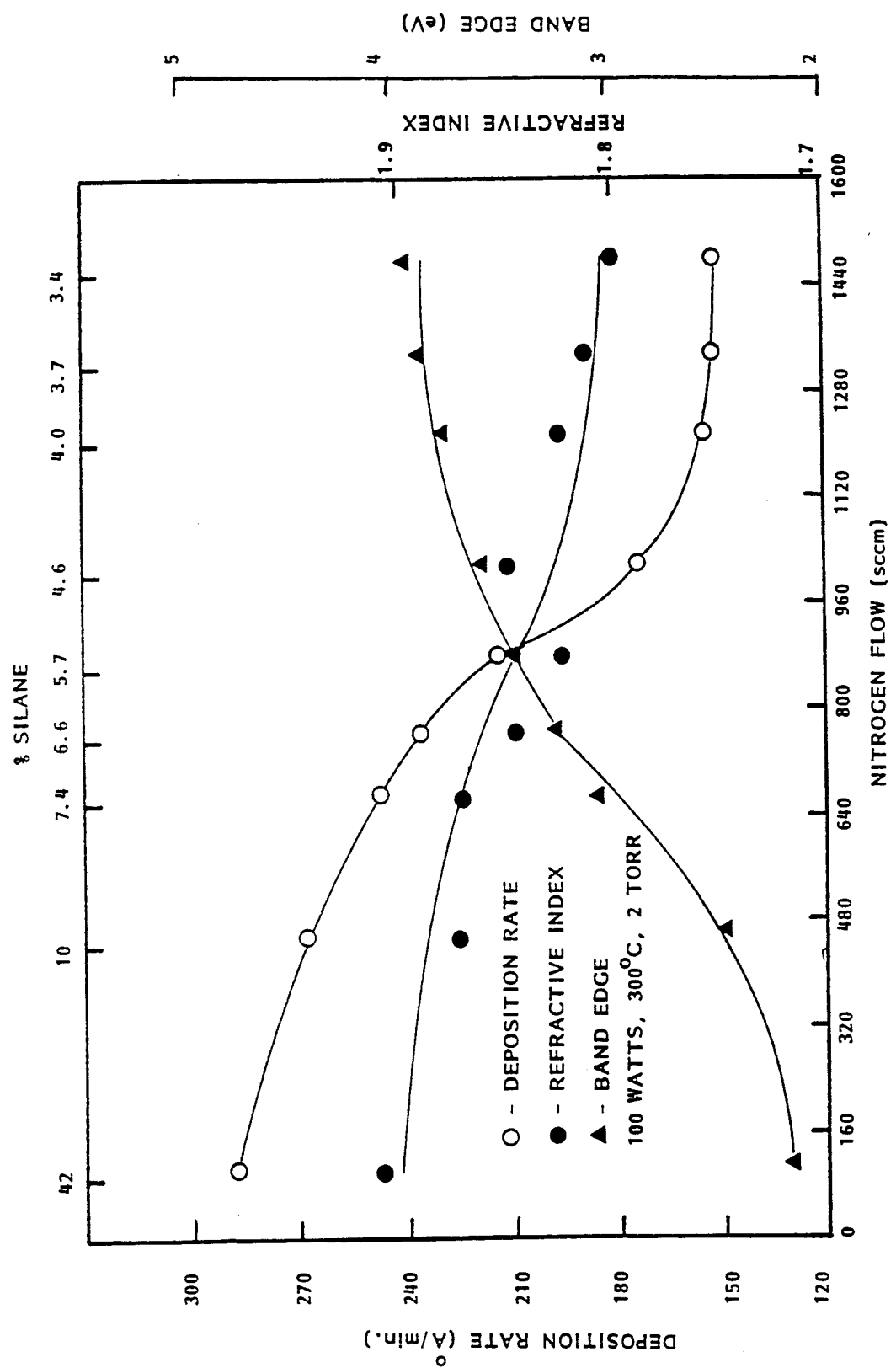
FIG. 2 illustrates deposition rate, refractive index, and band edge as a function of nitrogen flow.

FIGS. 1 and 2 illustrate deposition rate, refractive index and band edge as a function of gas ratio and nitrogen flow, respectively. The horizontal axes of the FIGURES are also calibrated in percent silane of the total gas flow.

As illustrated, deposition rate and refractive index decreased and band edge increased with increasing gas ratio and nitrogen flow. The trends in these three parameters were a result of decreasing excess silicon incorporation in the film as the amount of nitrating agent in the reactant gas stream increased. The films varied from very silicon-rich for small gas ratios and nitrogen flows to a Si/N ratio of 0.75 as gas ratio and nitrogen flow increased.

Figure 3:
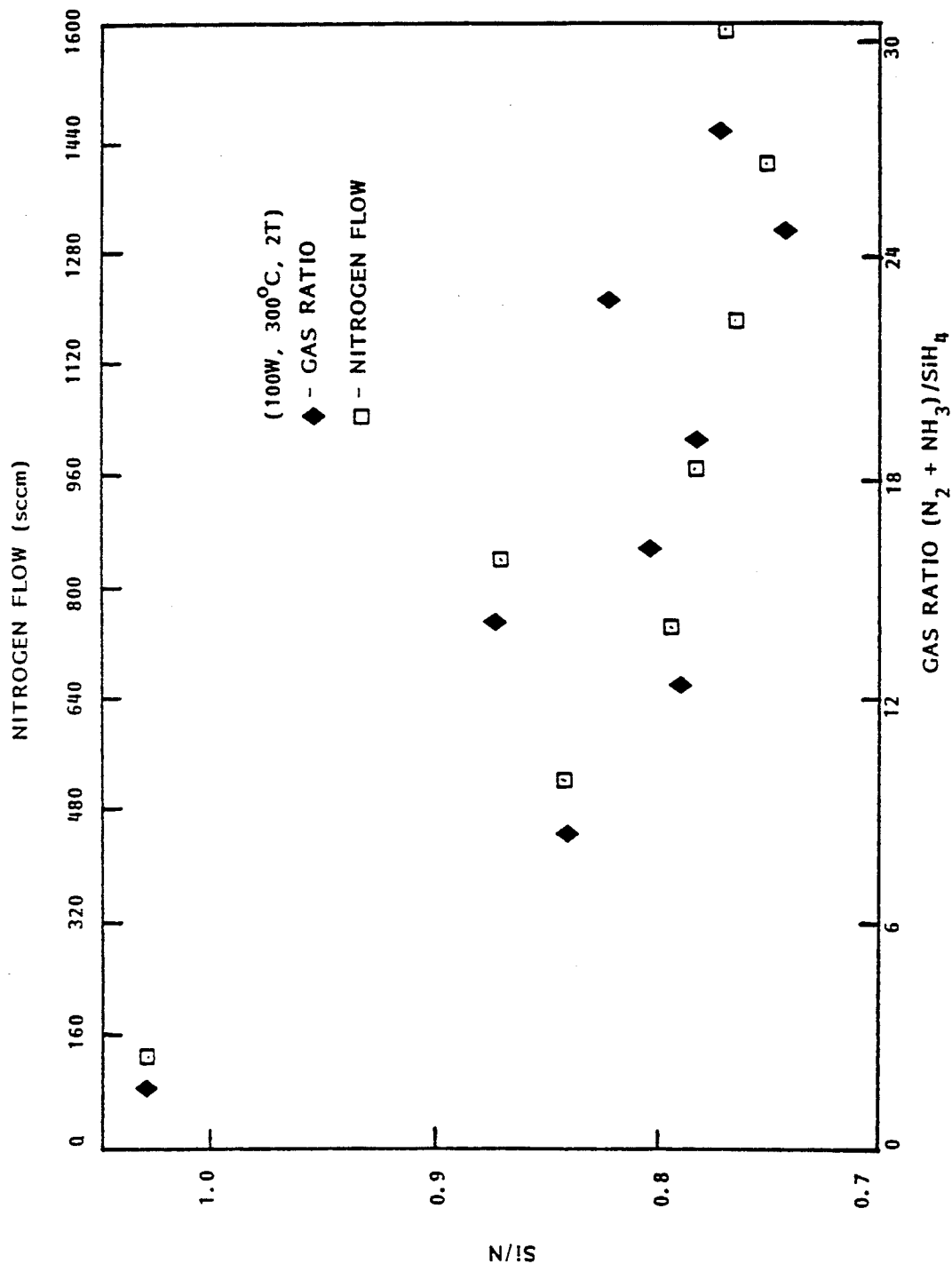
FIG. 3 illustrates silicon to nitrogen ratios determined by auger analysis.

Silicoh to nitrogen ratios determined by Auger analysis and corresponding to the data points of FIGS. 1 and 2 are presented in FIG. 3. As illustrated, Si/N decreased as both gas ratio and nitrogen flow increased. Although PECVD silicon nitride films are known to be amorphous, a stoichiometric value of 0.75 for Si/N was approached for gas ratios greater than 22 ($1 < NH_3/SiH_4 < 10$; total gas flow $>2000$ sccm) and nitrogen flows in excess of 1250 sccm ($NH_3/SiH_4=40$ sccm/50 sccm; total gas flow $>2000$). These results indicate that for high total gas flows, the silicon to nitrogen ratio of the film becomes independent of the $NH_3/SiH_4$ ratio and may be controlled by the residence time of the reactant species.

Figure 4:
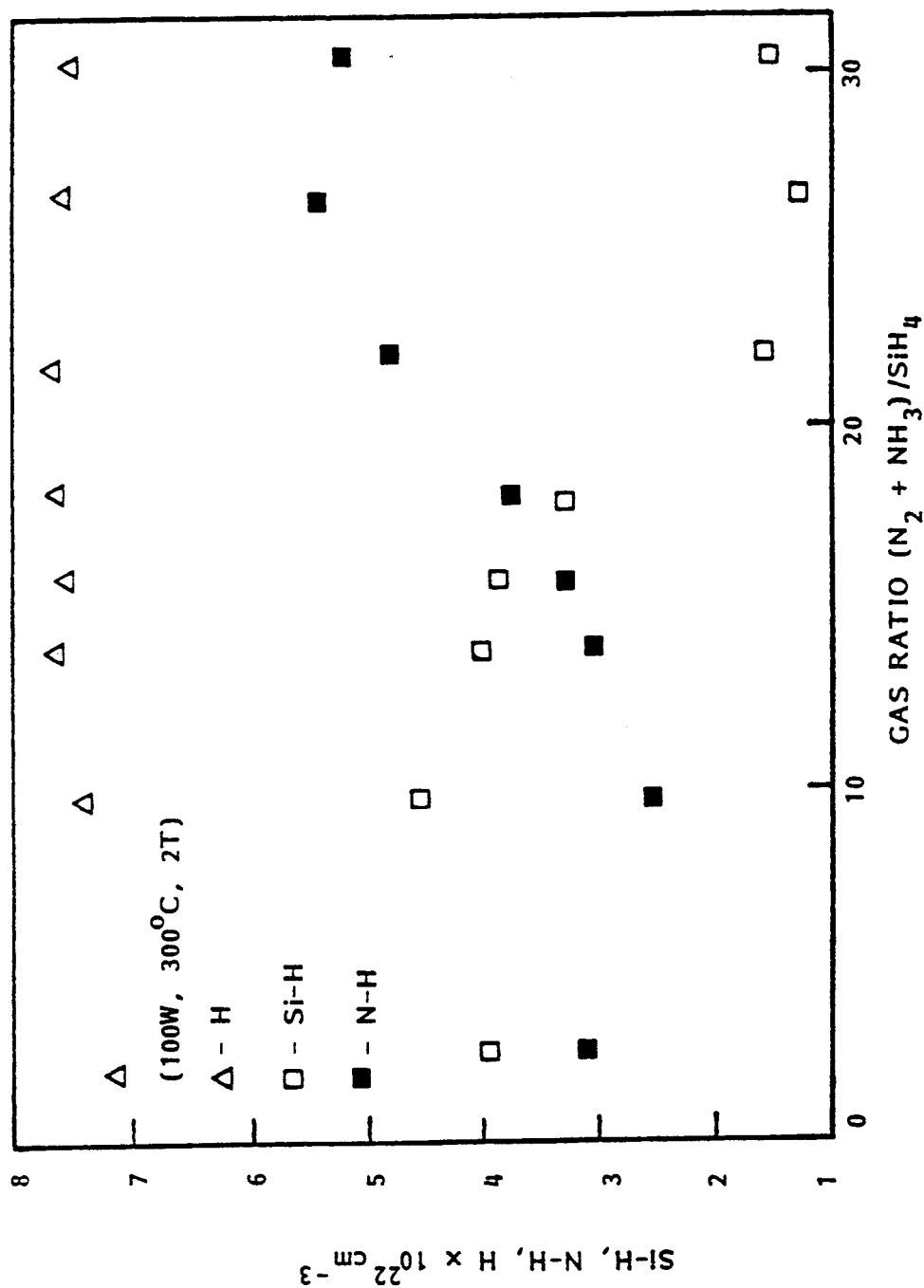
FIG. 4 illustrates the variation of Si—H and N—H bond concentration with respect to the gas ratio of $(N_2+NH_3)$ to $SiH_4$.
Figure 5:
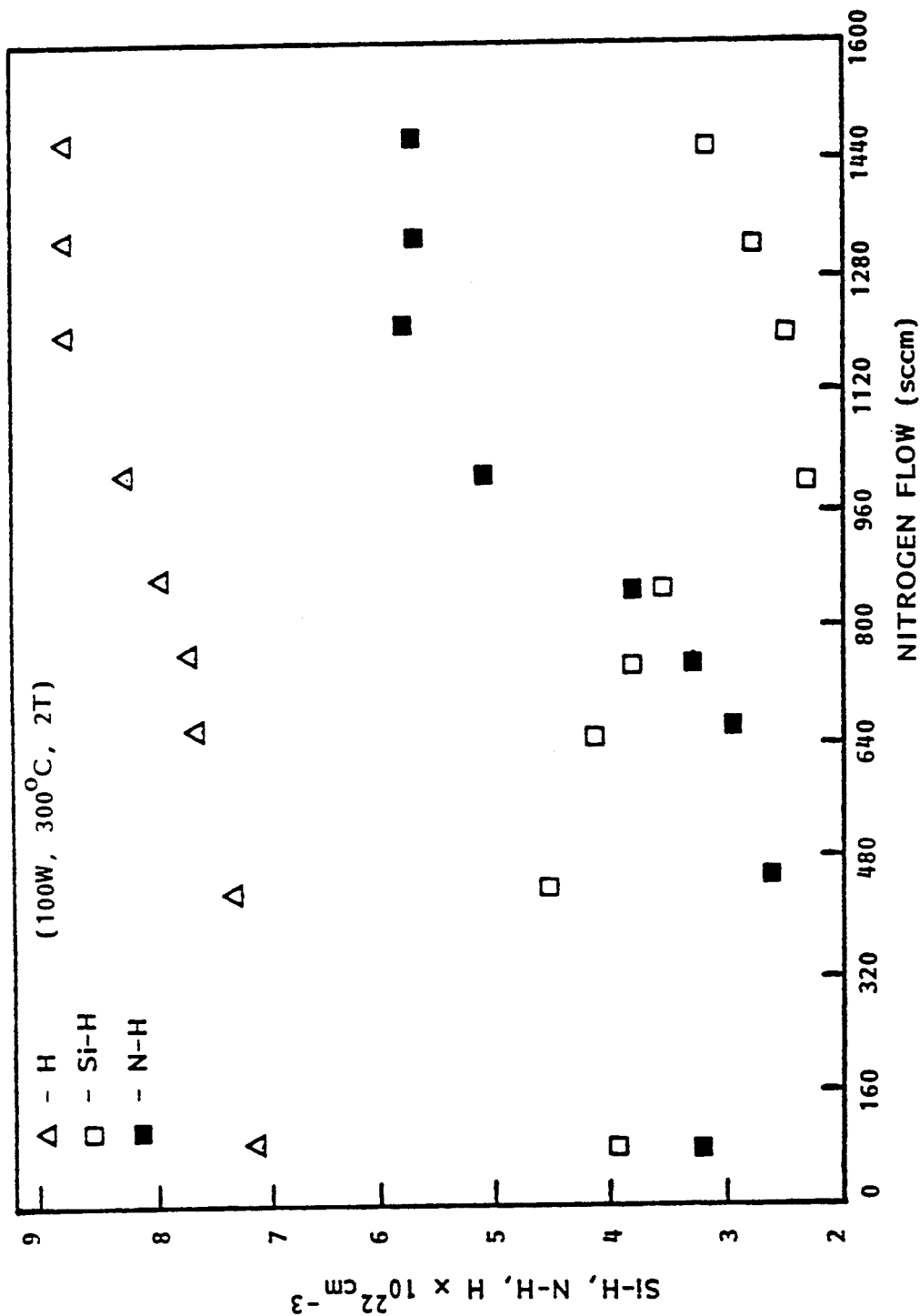
FIG. 5 illustrates the variation of Si—H and N—H bond concentration with respect to nitrogen flow.

The variation of Si—H and N—H bond concentration with gas ratio and nitrogen flow is illustrated in FIGS. 4 and 5, respectively. The data were calculated from infrared absorption spectra using the method of W. A. Lanford and M. J. Rand, 49 J. Appl. Phys. 2473 (1978). As gas ratio and nitrogen flow increased, the N—H bond concentration increased with a concomitant decrease in Si—H bond concentration. This indicates that hydrogen preferentially passivated nitrogen instead of silicon when the gas stream contained a large concentration of nitrating agent. These observations are also consistent with the fact that the percent silane in the gas stream decreased with increasing gas ratio and nitrogen flow.

In FIG. 5, it is illustrated that the hydrogen bond concentration increased slightly between 480 and 1150 sccm of nitrogen flow. Also, the band edge only rose to a value of 4.0 eV and the refractive index decreased to 1.8 (see FIG. 2) for high nitrogen flows. This indicates that these films contained a larger amount of hydrogen than those deposited at high gas ratios. This additional hydrogen was bonded to nitrogen and may be due to incomplete dissociation of the reactant gases at the higher flow rates.

High-frequency C-V curves were used to obtain write/erase, retention and endurance characteristics from MNOS capacitors. A light source was used to ensure sufficient minority carrier availability during programming operations using short pulse widths and read disturb was minimized by closely controlling the amount of time that voltage was applied to the devices under test.

Figure 6:
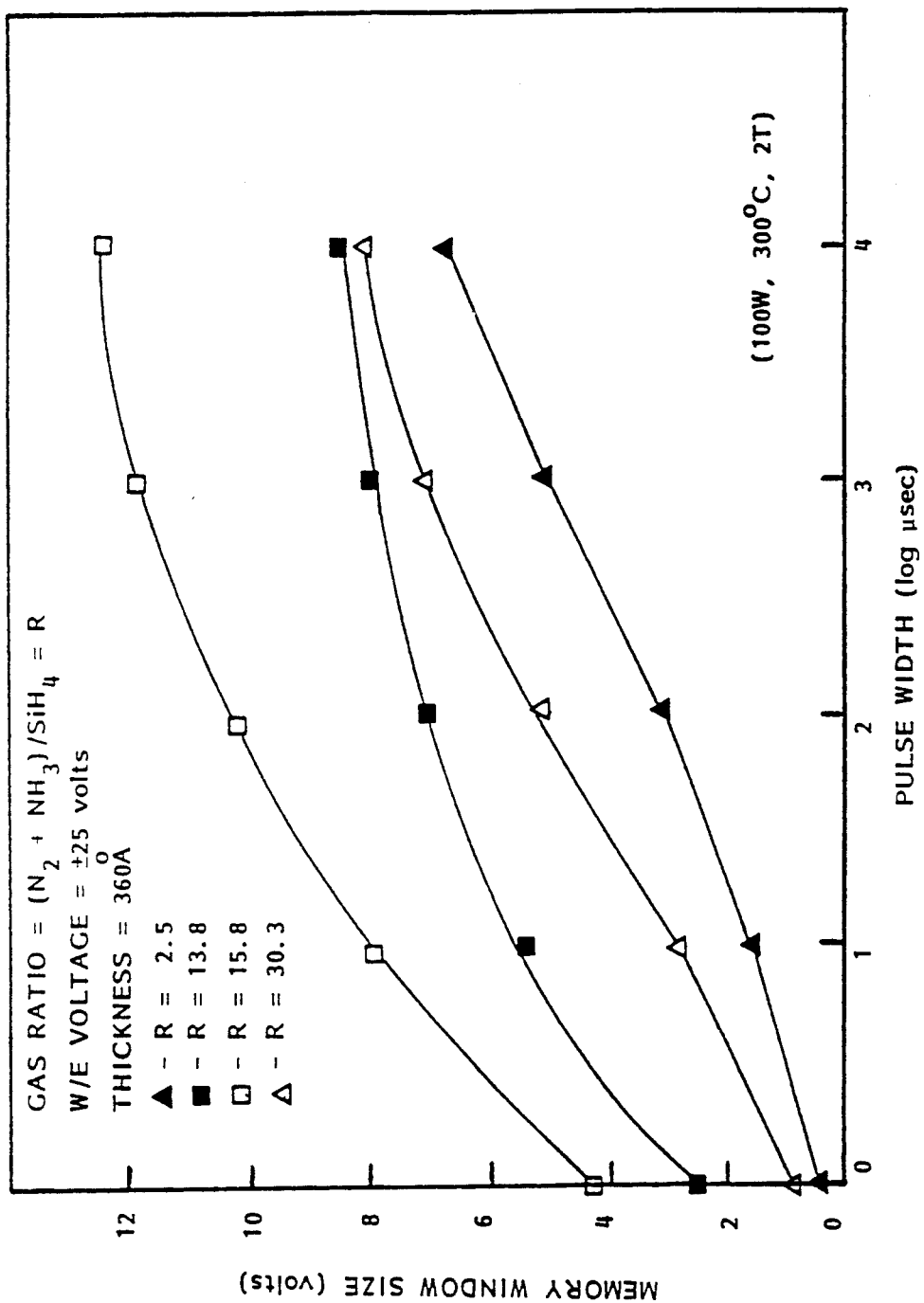
FIG. 6 illustrates the variation of memory window size versus pulse width with the gas ratio as a third parameter.
Figure 7:
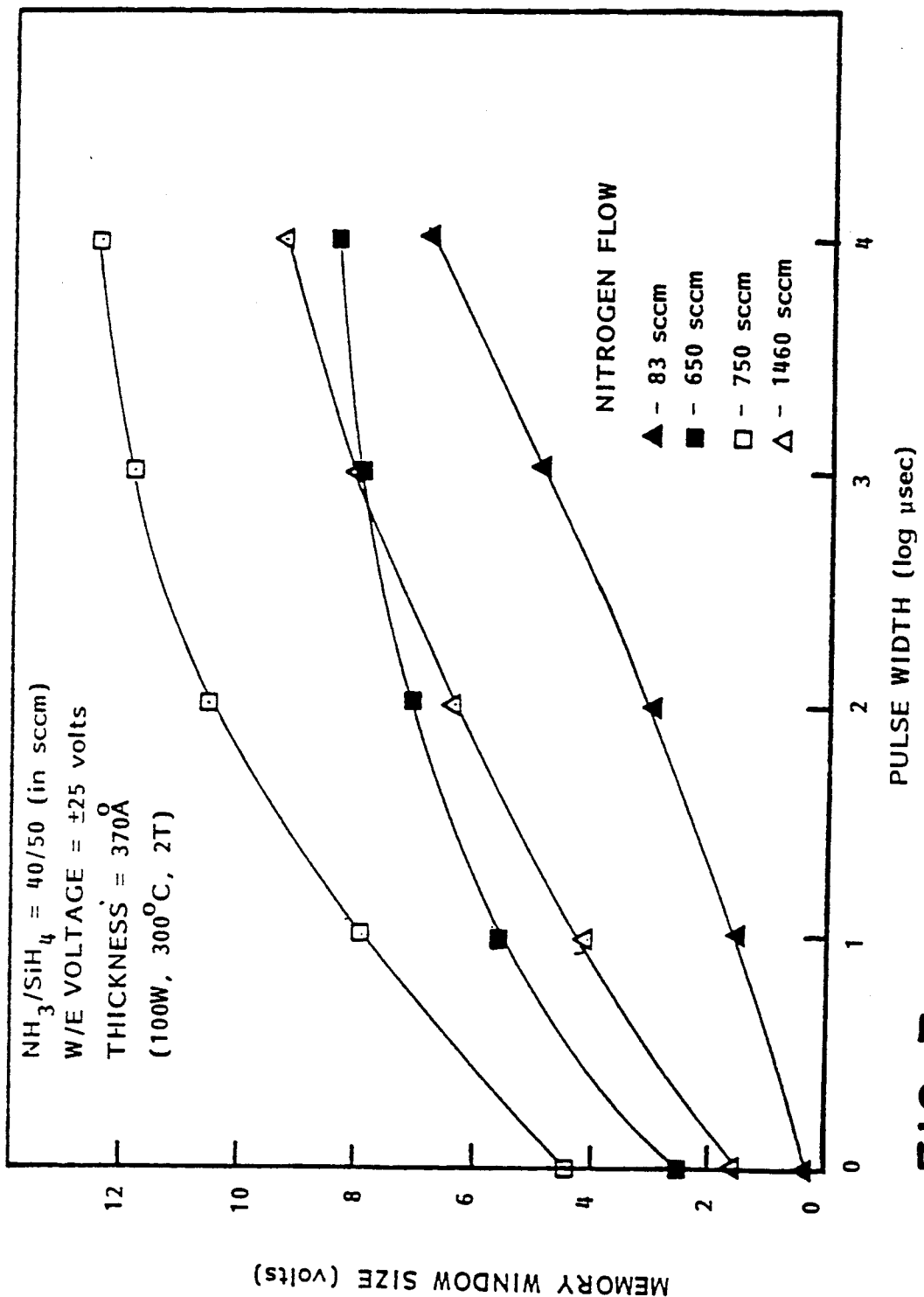
FIG. 7 illustrates memory window size variation versus pulse width with nitrogen flow as a third parameter.

FIGS. 6 and 7 present memory window size data versus pulse width with gas ratio and nitrogen flow as the third parameter, respectively. As illustrated, the memory window size increased approximately logarithmically with pulse width and showed a tendency toward saturation for long pulse widths. The general shape of the illustrated curves is similar to those of LPCVD devices. The largest memory windows were obtained for a gas ratio of 15.8 and a nitrogen flow of 750 sccm. FTIR and Auger analysis showed these films to be slightly silicon rich. The poor performance of films with larger amounts of excess silicon is attributable to the high film conductivity which enhances back-tunneling of injected charges from the nitride to the silicon. For large gas ratios and nitrogen flows, the Si/N ratios of the films approached 0.75 and the devices exhibited acceptable window sizes, excellent charge retention and reasonable endurance performance. These results suggest that some excess silicon bonded as Si—H is desirable for charge trapping and retention to be effective in PECVD silicon nitride.

Figure 8:
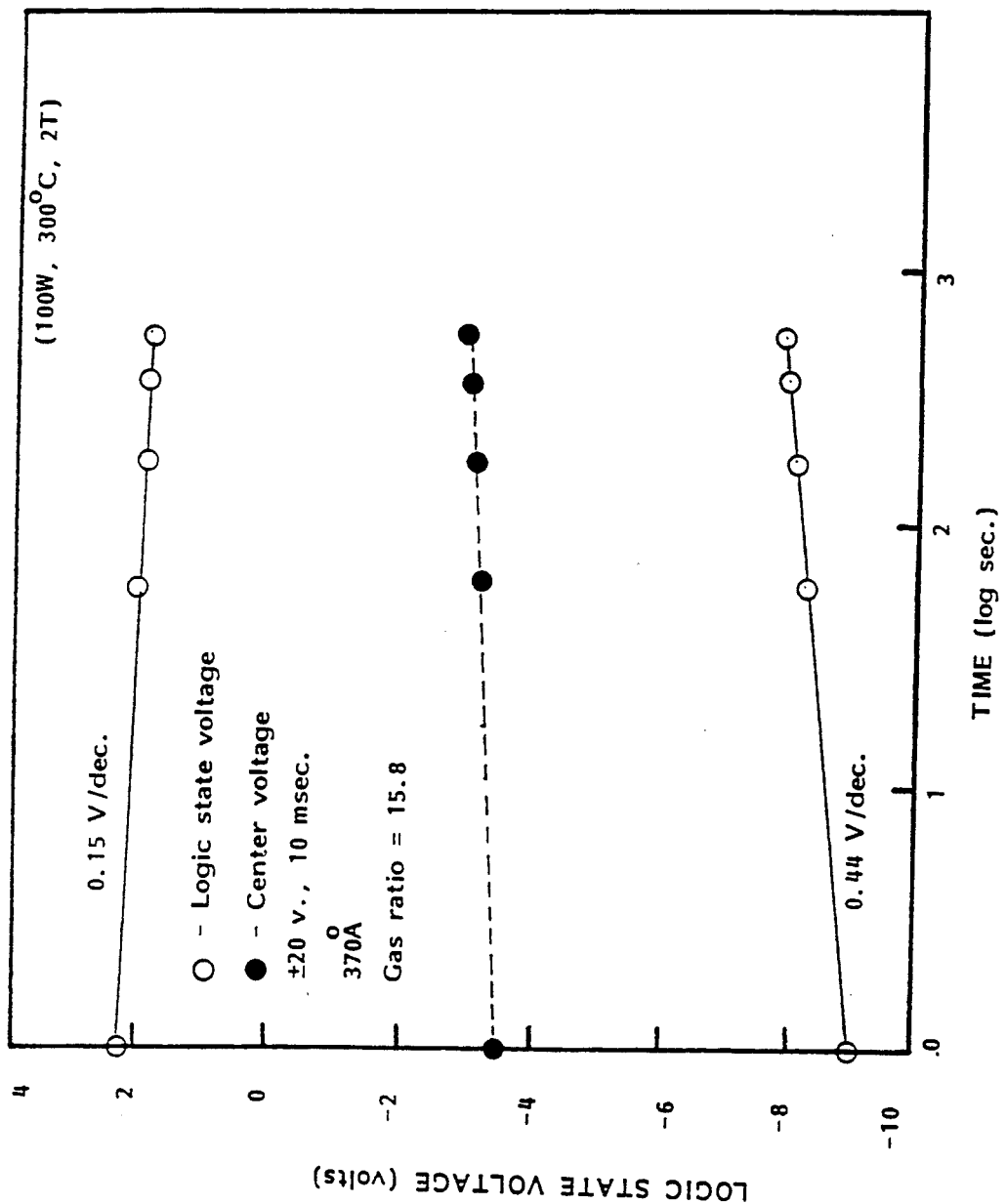
FIG. 8 illustrates typical logic voltage versus decay time for a device fabricated with nitride deposited using "optimum" deposition conditions.

Charge retention measurements were made on devices for all variations of the deposition gas stream. FIG. 8 illustrates typical data for a device fabricated with nitride deposited using "optimum" deposition conditions. The two logic states decay at different rates as expected, producing a window decay rate of 0.6 volts per decade of time in seconds. The charge decay is logarithmic with time and is consistent with results for LPCVD nitride reported previously by others.

Figure 9:
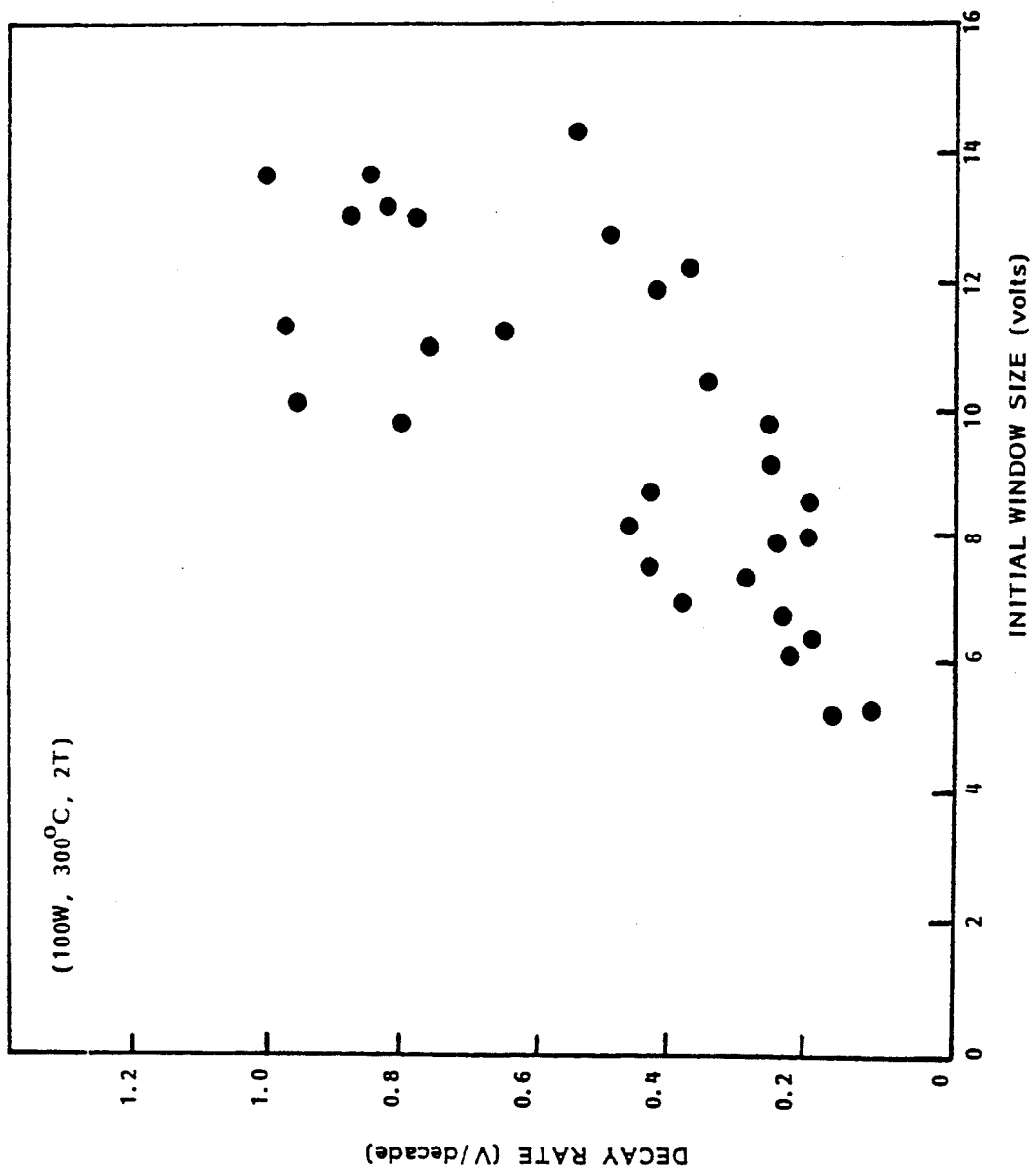
FIG. 9 illustrates decay rates of devices fabricated at various values of gas ratio and nitrogen flow.

FIG. 9 illustrates decay rates of devices fabricated at various values of gas ratio and nitrogen flow. Considering the initial memory window size, the decay rates were at the lower end of previously reported values for PECVD nitride and compared favorably with those of LPCVD nitride devices.

Figure 10:
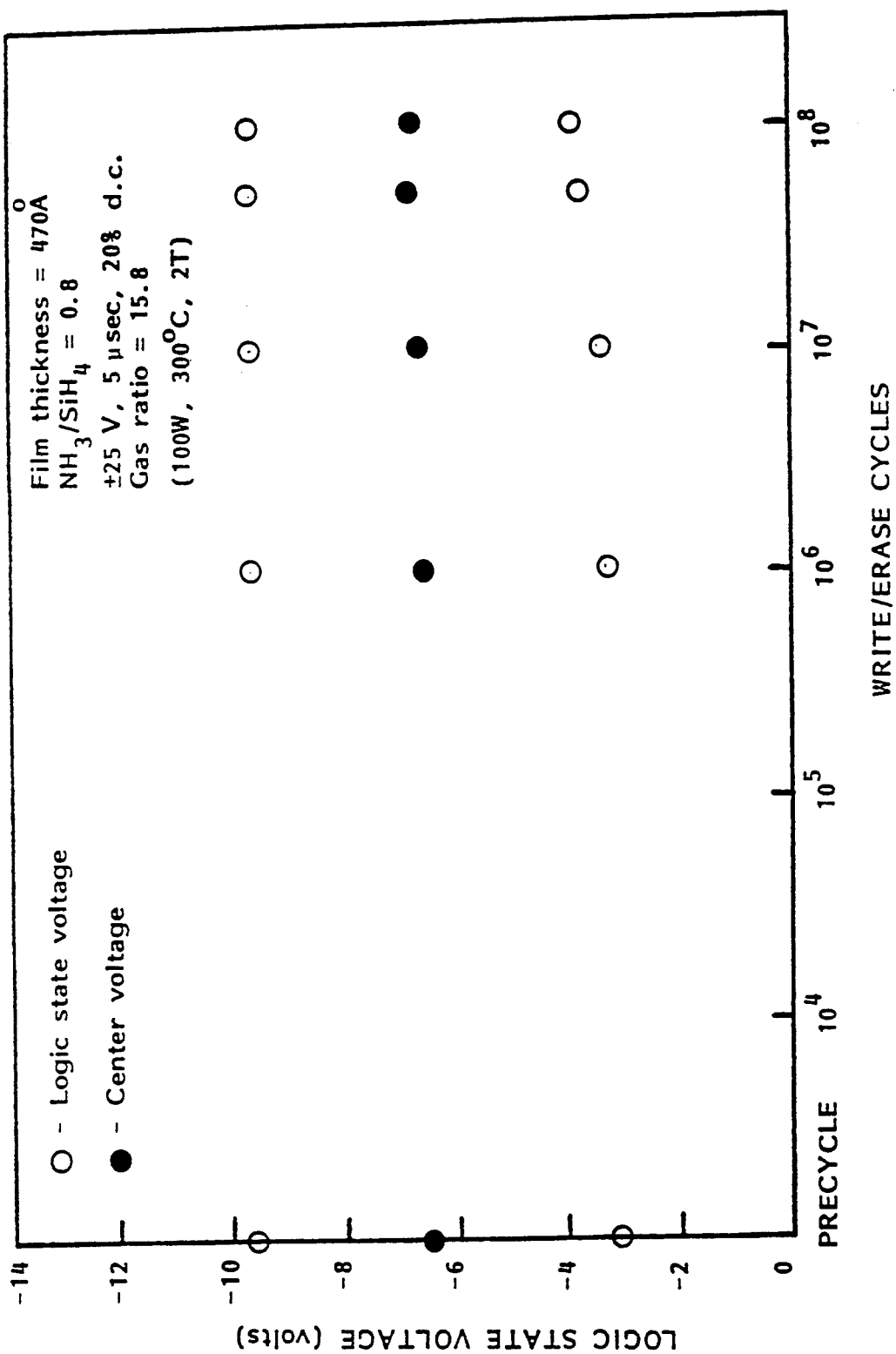
FIG. 10 illustrates endurance performance of a typical test device.

The endurance performance of a typical test device is illustrated in FIG. 10. The memory window size was only slightly smaller after $10^8$ cycles and the shift in window center was small. Furthermore, there is no evidence of impending catastrophic failure. Retention data was also taken after endurance cycling to various levels. Although charge retention was degraded by endurance cycling, the results were comparable to those reported for MNOS and MONOS devices fabricated with APCVD and LPCVD nitride.

Figure 11:
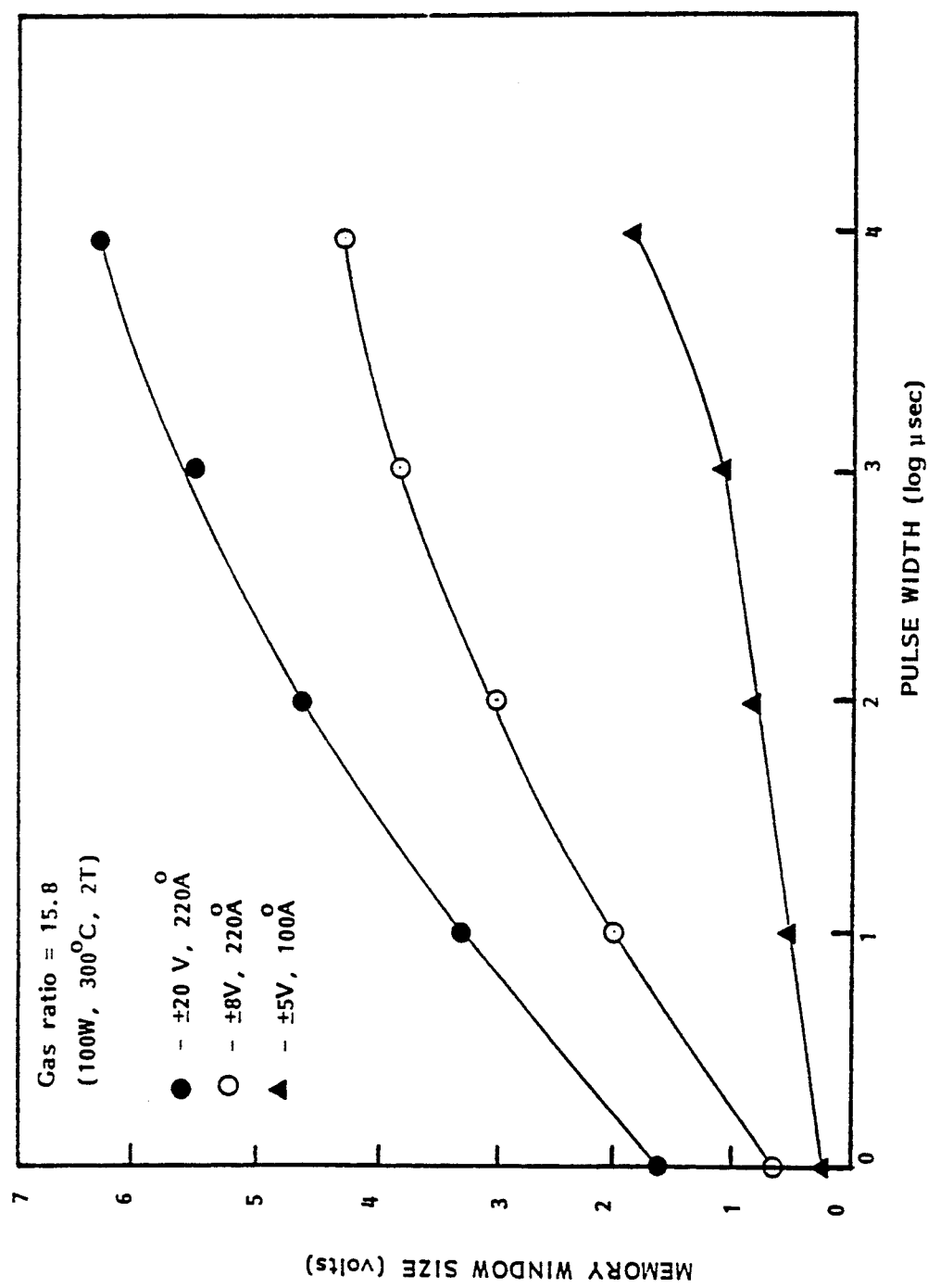
FIG. 11 illustrates write/erase characteristics for devices having 100 or 220 angstrom thick films deposited at a gas ratio of 15.8.
Figure 12:
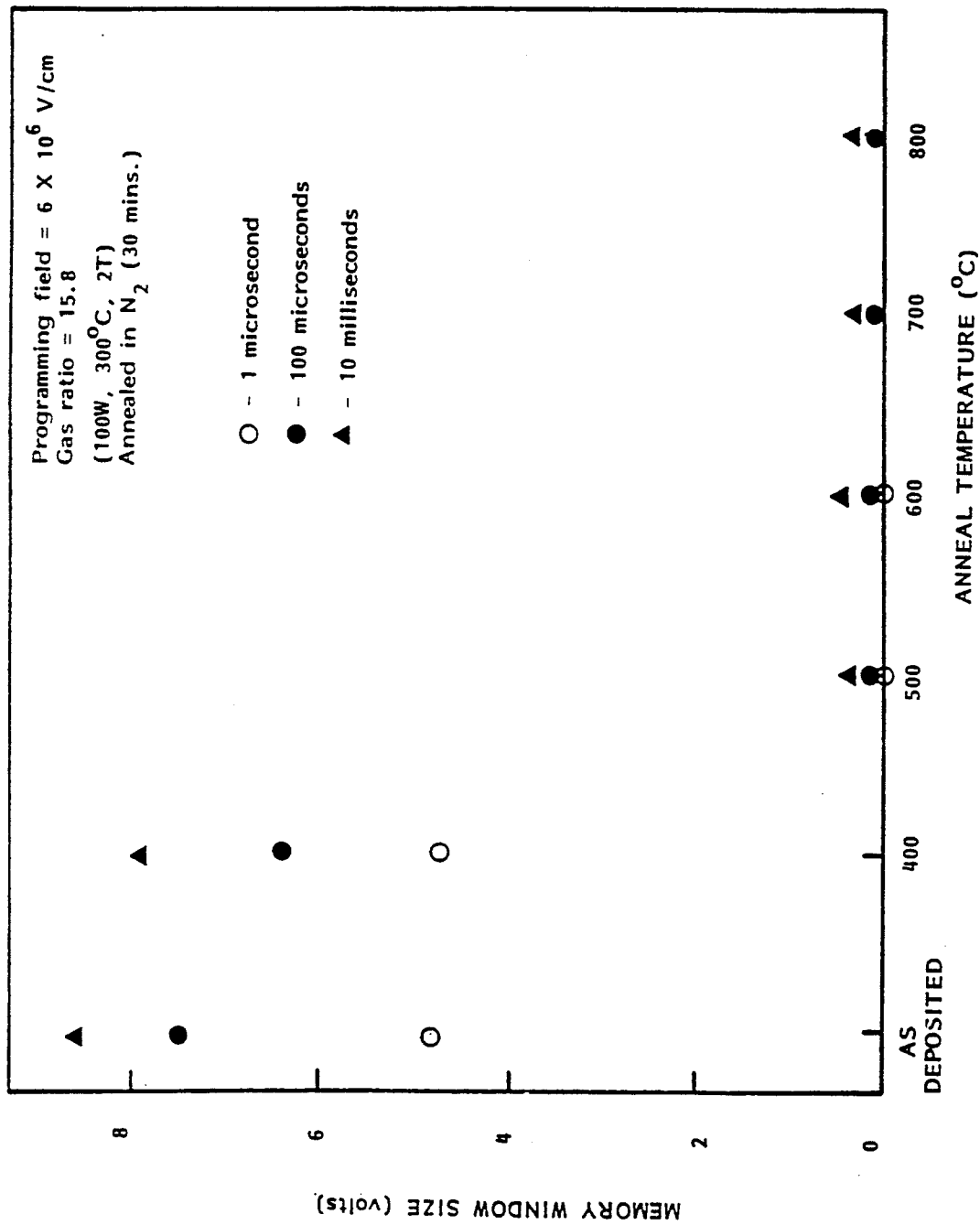
FIG. 12 illustrates memory window size variation with anneal temperature relating to the growth of a blocking oxide and steam at 600° C.
Figure 13:
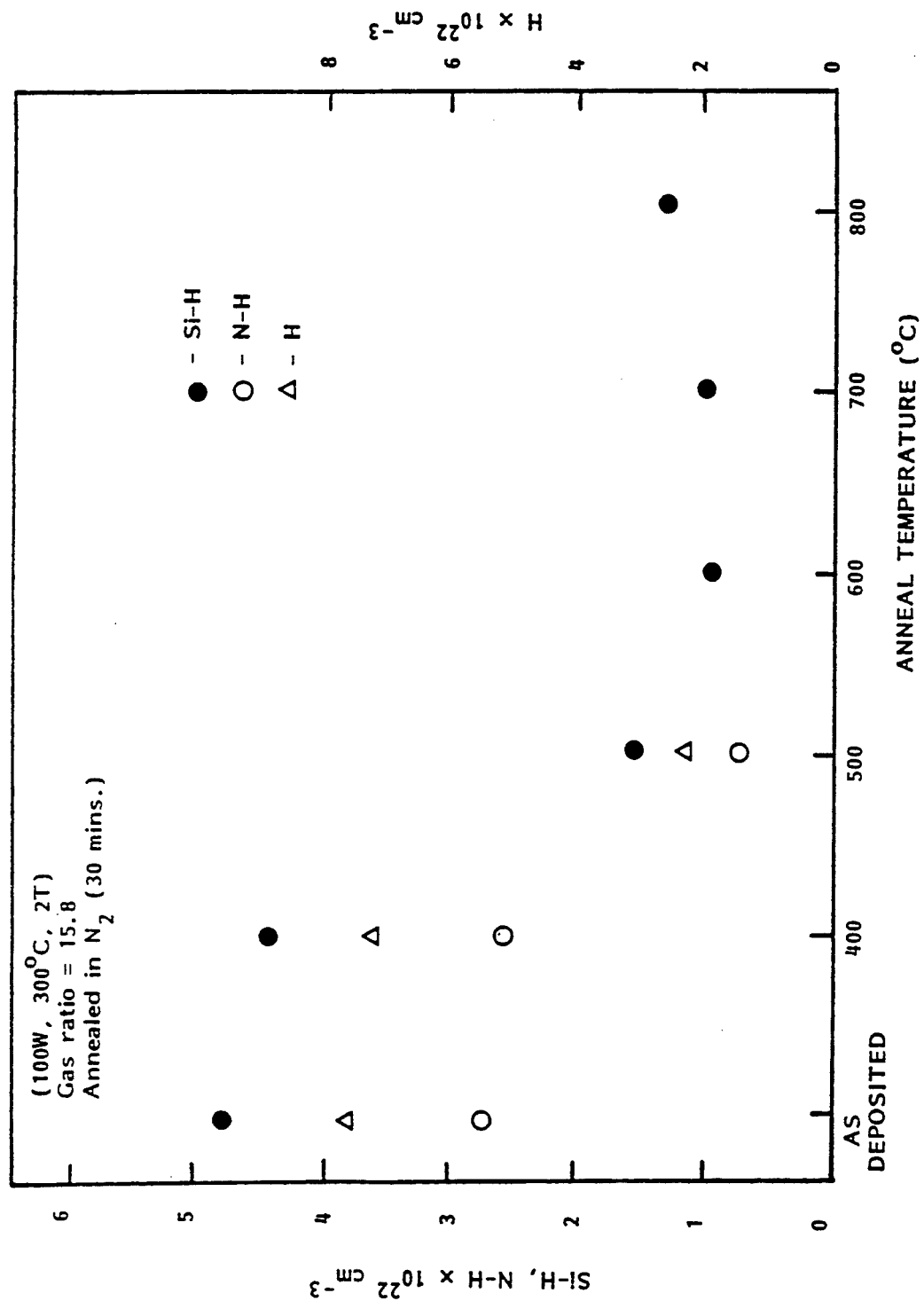
FIG. 13 illustrates Si—H bond concentration as a function of anneal temperature for growth of a blocking oxide and steam at 600° C.

In order to assess the potential for application of PECVD nitride in low-voltage MNOS structures, 100 and 220 angstrom thick films were deposited at a gas ratio of 15.8. As illustrated in FIG. 11, the devices exhibited reasonable write/erase characteristics but charge retention was poor, probably due to leakage of charge through the gate electrode. Attempts at growing a blocking oxide in steam at 600° C. were unsuccessful because of the outdiffusion of hydrogen during the oxidation step. The loss of hydrogen during post-deposition, high-temperature processing was confirmed by the data illustrated in FIGS. 12 and 13. Memory window size variation with anneal temperature (FIG. 12) paralleled that of the Si—H bond concentration shown in FIG. 13. These results suggest that charge trapping in PECVD silicon nitride requires the presence of hydrogen bonded to silicon. However, it is not clear whether the loss of memory performance was the result of an increase in silicon dangling bonds with the loss of hydrogen or the loss of trapping centers due to the decrease in Si—H bonds.

Annealing

Loss of hydrogen from APCVD and LPCVD silicon nitride during high-temperature annealing has been well documented. However, unlike PECVD nitride which essentially loses its ability to perform as a charge trapping medium after annealing at temperatures of 500 °C. and higher (see FIG. 12), APCVD and LPCVD nitride devices continue to function with only slight changes in performance parameters following post-deposition processing at temperatures up to 900° C.

Results reported previously in the art for PECVD nitride suggest that, for annealing temperatures at less than 500° C., hydrogen can transfer from N to Si and annealing of disorder in the films is possible. Consequently, further annealing studies were undertaken at temperatures ranging from a deposition temperature of 300° C. to 500° C. Also, in place of the conventional techniques used to insert samples into and withdraw samples from the annealing furnace, a step procedure was followed whereby samples were raised from room temperature to the final annealing temperature in increments of 50°0 C. and/or 100°0 C. The reverse sequence was then used to withdraw the samples. All annealing was accomplished in a nitrogen environment and times of 30 and 40 minutes and longer were used to simulate typical post-deposition, high-temperature processes.

Figure 14:
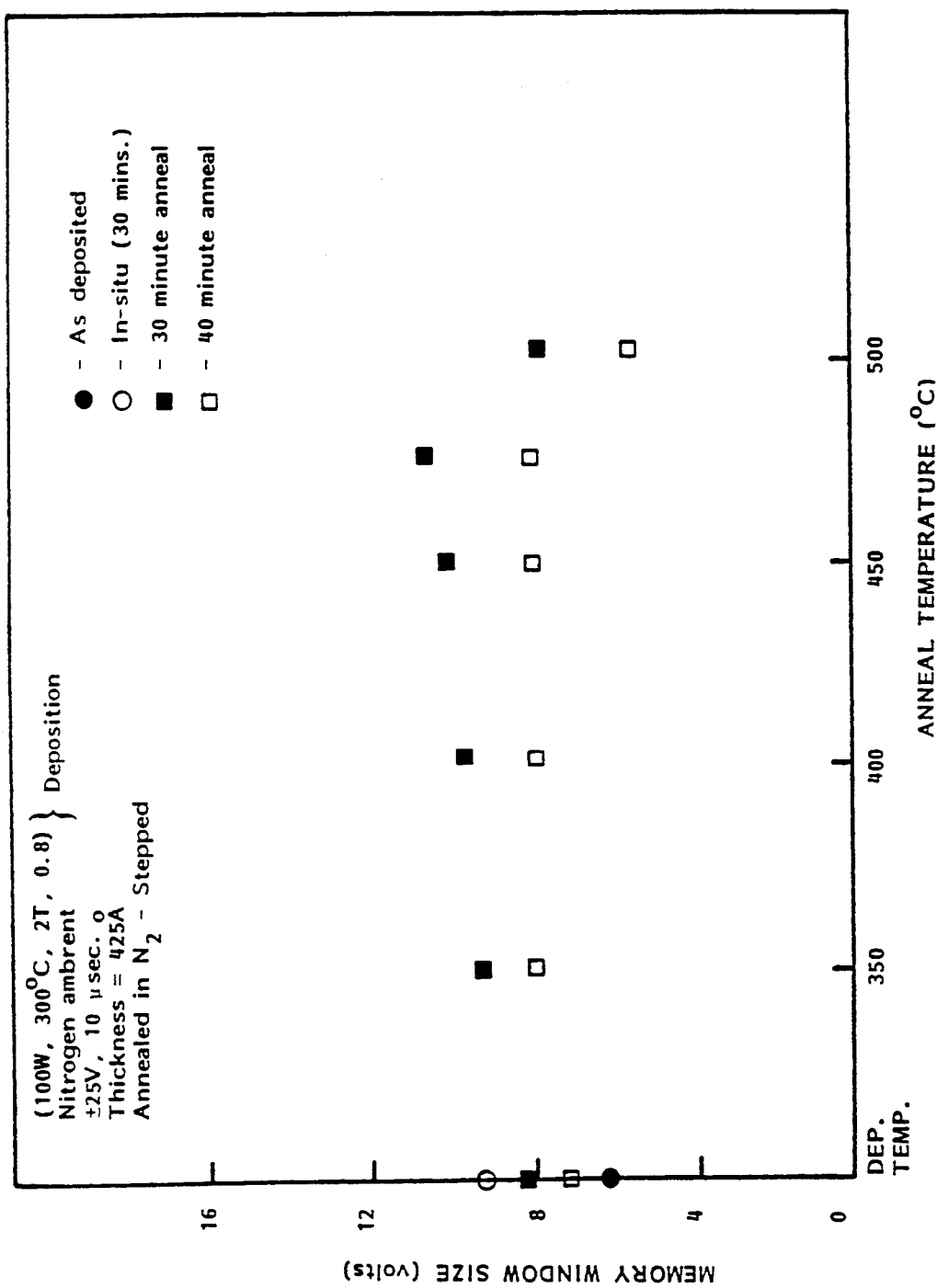
FIG. 14 illustrates a plot of memory window size versus anneal temperature devices which were annealed for 30 and 40 minutes.

FIG. 14 illustrates a plot of memory window size versus anneal temperature for devices which were annealed for 30 and 40 minutes. Data for in-situ annealed (films remained inside the reactor for 30 minutes at 300° C. with nitrogen flowing) and "as-deposited" films are included in the FIGURE for comparison purposes. These results indicate that memory performance can be enhanced by annealing at temperatures up to 500°0 C. with the most significant improvement occurring for 30 minutes at 475°0 C. Furthermore, in-situ and conventional annealing at 300° C. produced a small increase in memory window size suggesting that some reordering in the film may have occurred. The decrease in window size at 500° C. indicates the beginning of severe degradation of memory properties.

Figure 15:
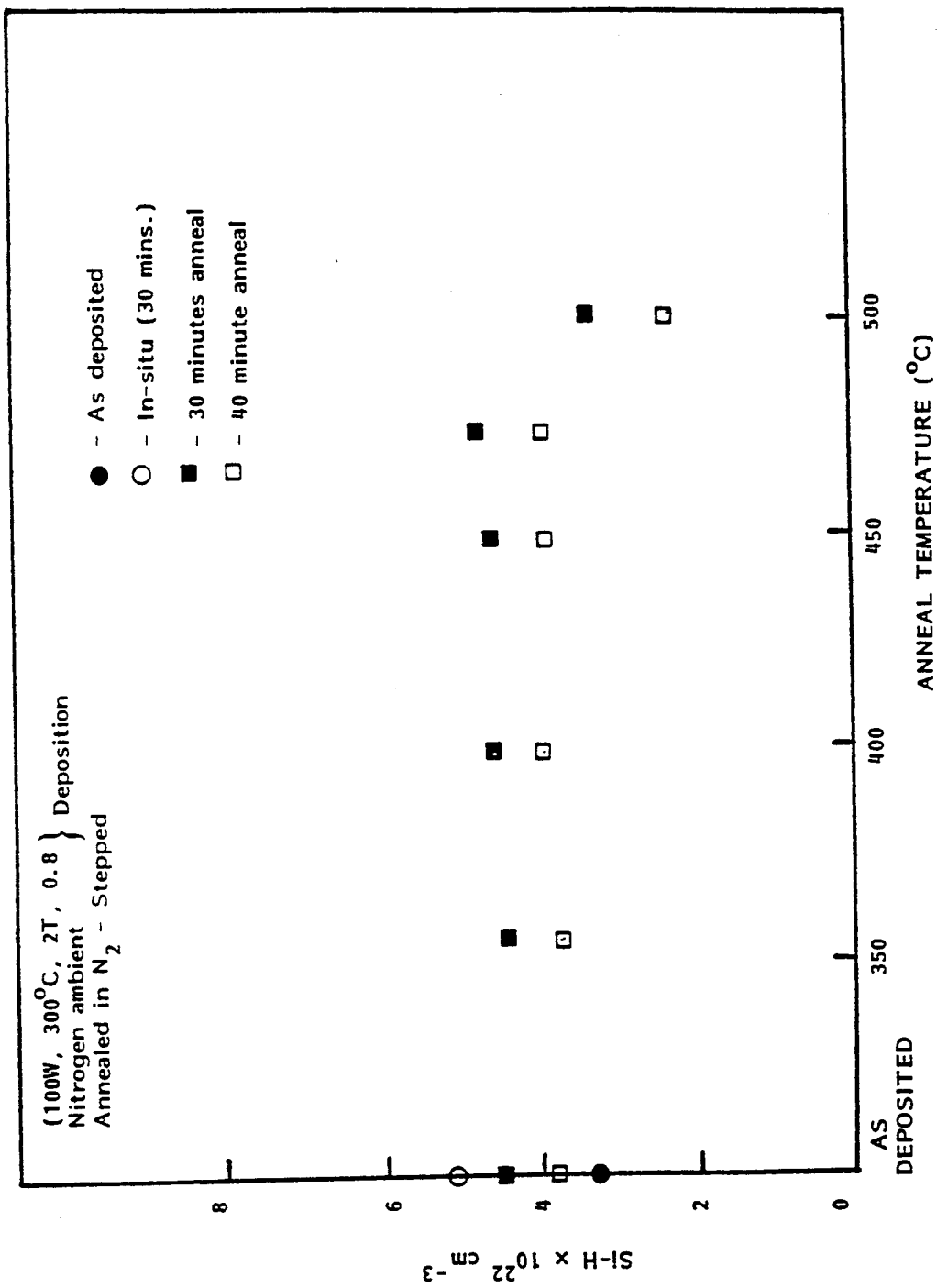
FIG. 15 illustrates Si—H bond concentration variation with anneal temperature and time corresponding to the data of FIG. 14.

The Si—H bond concentration variation with annealing temperature and time corresponding to the data of FIG. 14 is presented in FIG. 15. The Si—H concentration correlated very well with memory window size as anticipated from the previous annealing results of FIGS. 12 and 13. Furthermore, the data suggests that improvement in memory window size with annealing is a result of the transfer of hydrogen from nitrogen to silicon. Also, since the energetics of hydrogen loss are determined by N—H and Si—H bond dissociation, and hydrogen movement in the film is considered to be diffusion-limited, the time dependence of the annealing process is understandable.

Figure 16:
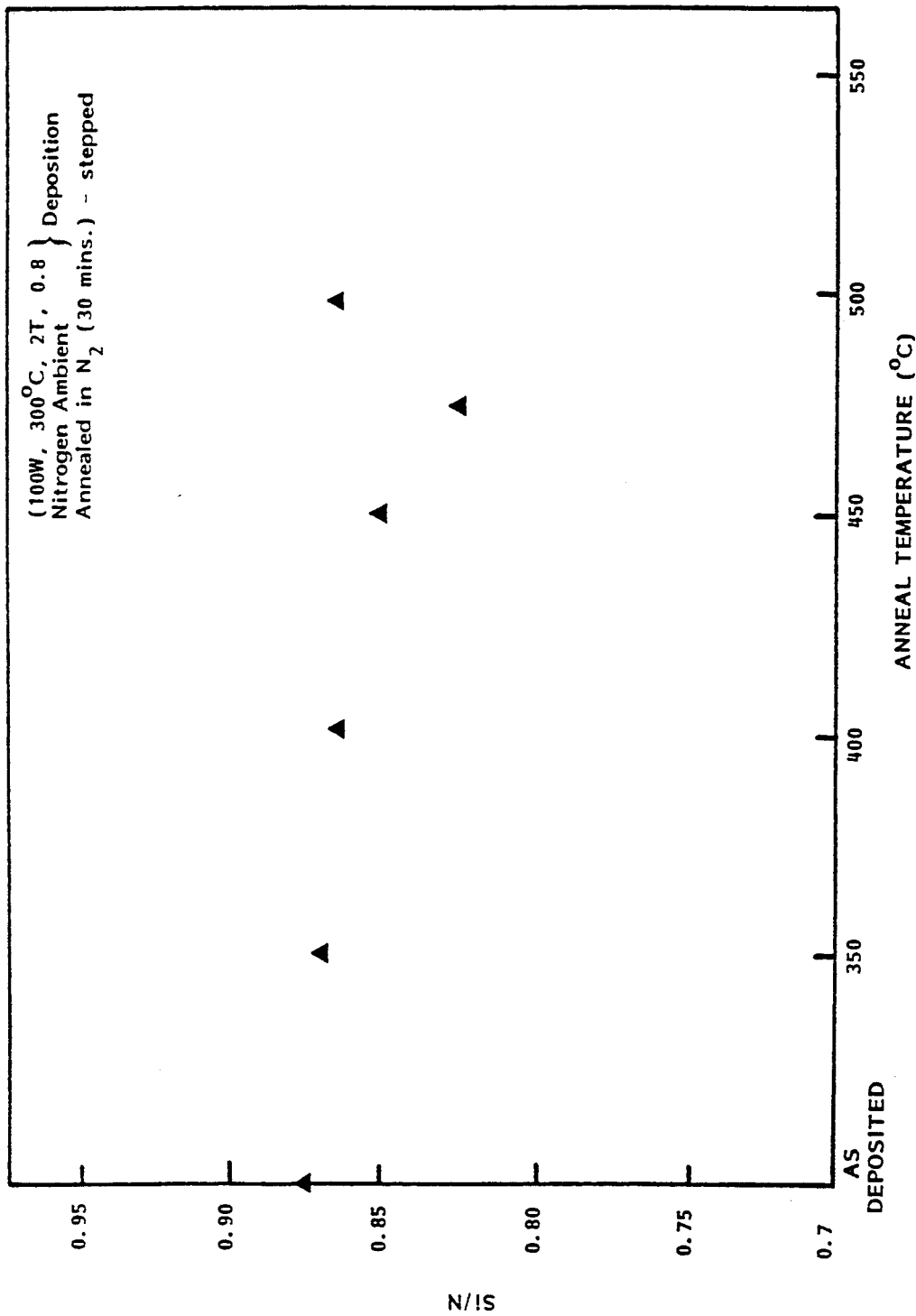
FIG. 16 illustrates the variation of silicon to nitrogen with annealing temperature for the films of FIGS. 14 and 15.

Auger electron spectroscopy was used to determine the Si/N ratios for the films of FIGS. 14 and 15 which had been annealed for 30 minutes. FIG. 16 illustrates the variation of Si/N with annealing temperature. Although published values for the diffusion coefficient of nitrogen in silicon nitride do not support the movement of nitrogen at these temperatures, the data do suggest that nitrogen was lost from and supplied to these films during annealing. Additionally, a comparison of FIGS. 15 and 16 reveals an inverse relationship between Si—H bond concentration and Si/N ratio. Although sufficient data is not available to explain this apparent relationship, the minimum Si/N and maximun Si—H concentration do correlate with maximum window size for annealing at 4750° C. for 30 minutes. Consequently, this temperature and time was used for all subsequent work involving post-deposition annealing.

As discussed above, rapid thermal annealing (RTA) has recently received considerable attention as a processing tool for activating implants, growing thin insulating layers, and nitridation. However, RTA also can be used as an investigative tool to study materials for microelectronic applications.

Figure 17:
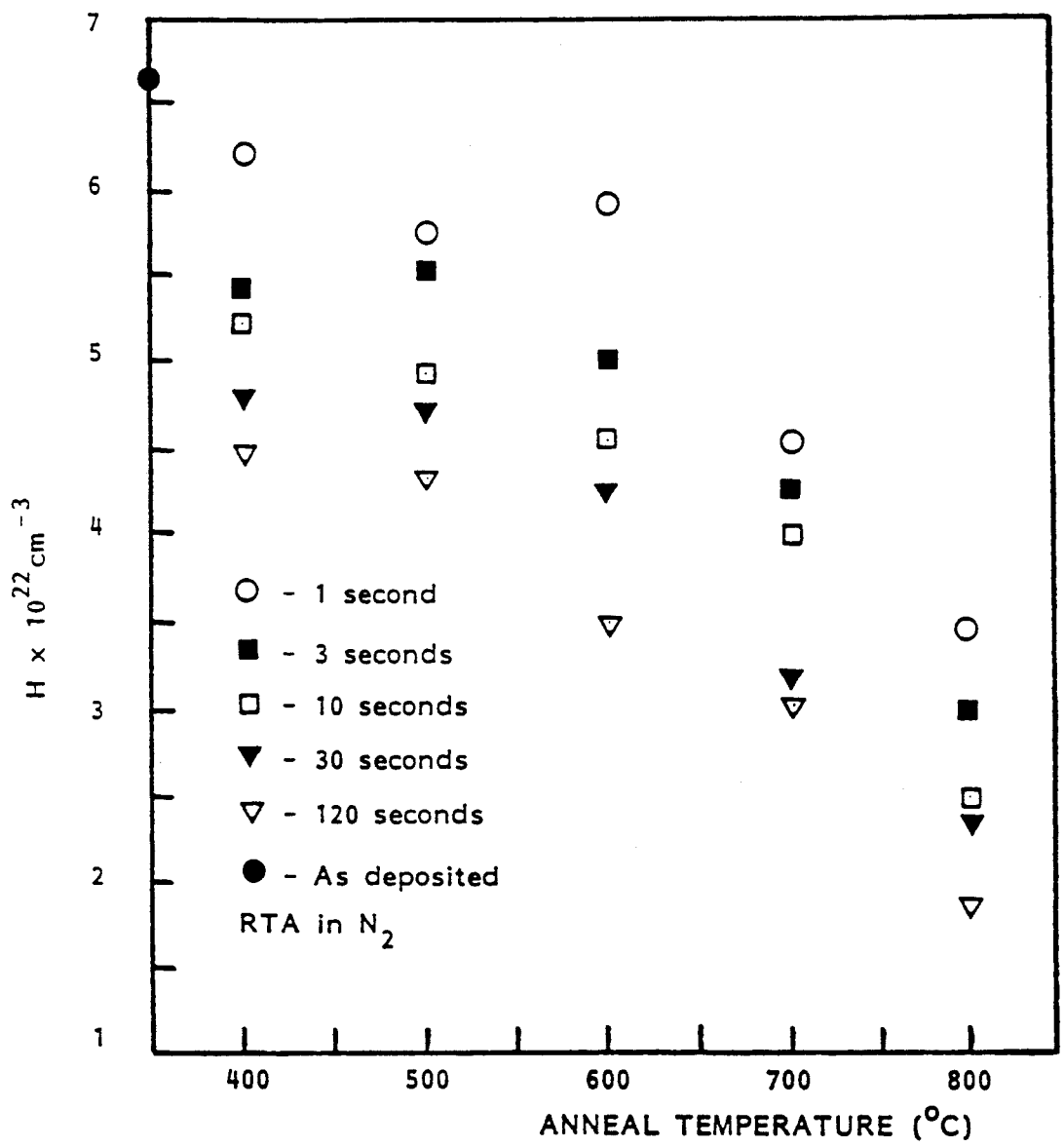
FIG. 17 illustrates a plot of hydrogen concentration versus rapid thermal annealing temperature with anneal time as a third parameter.

FIG. 17 illustrates a plot of hydrogen concentration versus rapid thermal annealing temperature with anneal time as a third parameter. For anneal times as short as one second at 400° C., the concentration of bonded hydrogen was reduced. For a given anneal time, the reduction in bonded hydrogen increases with anneal temperature, as expected. However, the amount of hydrogen lost for all rapid thermal anneal times and temperatures was substantially less than for conventional furnace annealing because of the much shorter time at temperature (see FIG. 13). The loss of hydrogen from both annealing processes was accompanied by a decrease in thickness and an increase in both refractive index and absorption edge. Densification of the film probably resulted from readjustment of bond angles between atoms and the increase in refractive index and absorption edge was undoubtedly related to the reduction in hydrogen.

Figure 18:
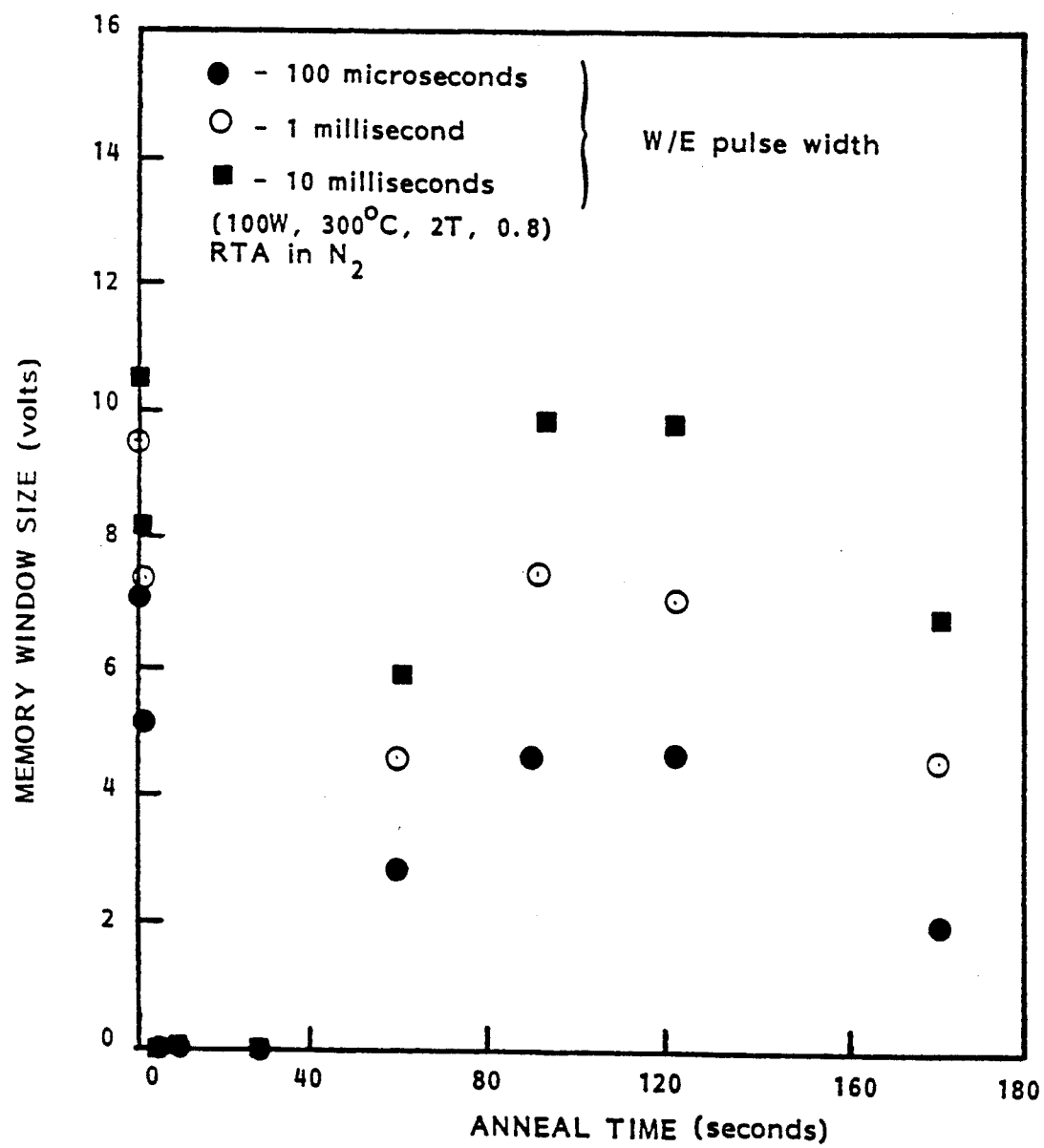
FIG. 18 illustrates variation and memory window size of MNOS capacitors with anneal time at 700° C. for three write/erase pulse widths.

The variation in memory window size of MNOS capacitors with anneal time at 700° C. is illustrated in FIG. 18 for three write/erase pulse widths. In general, annealing at this temperature produced smaller windows for all anneal times. Of particular interest, however, is that, for anneal times of 3, 10 and 30 seconds, the devices could not be written for any combination of pulse width and programming field. Examination of the FTIR spectroscopy acquired data illustrated in FIG. 19 reveals that the Si—H bond concentration decreased substantially for these anneal times while the N—H bond concentration increased and actually exceeded the value for "as-deposited" material following the 30 second anneal. This same effect was observed to a lesser degree in films annealed at 600° C. and was not evident at all in those annealed at 500° C. for times up to 180 seconds. The increase in N—H bond concentration for the 600° C. and 700° C. anneals apparently occurs as a result of the rupture of weak Si—N bonds.

Figure 19:
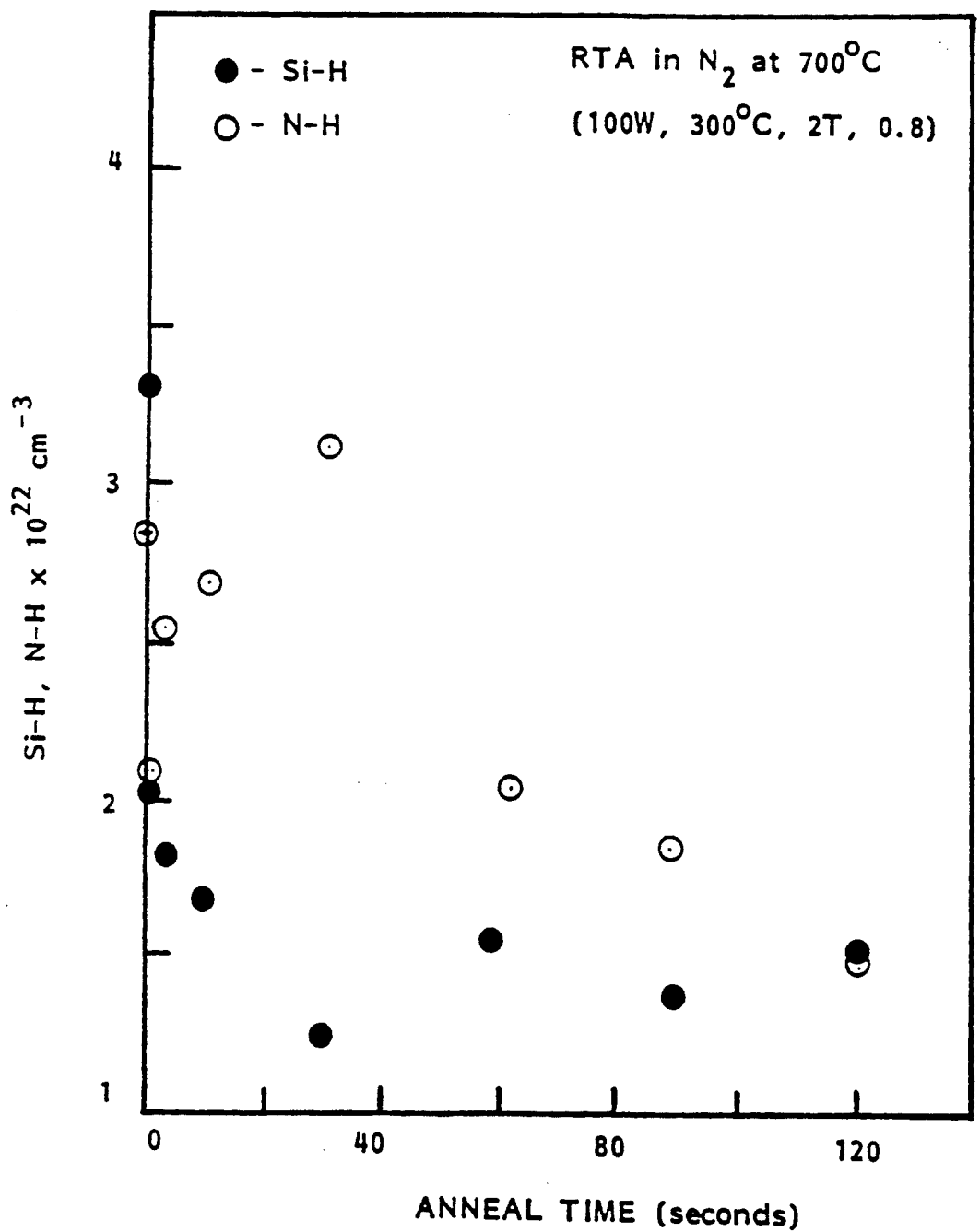
FIG. 19 illustrates FTIR spectroscopy data for rapidly thermal annealed substrates.

As a consequence of the increase in N—H bond concentration illustrated in FIG. 19 for anneal times of 3, 10 and 30 seconds, the Si—H/N—H ratios values for these times were quite low, ranging from 0.4 to 0.72. Thus, there appears to be a relationship between the ability to program a logic window in rapid thermal annealed PECVD silicon nitride MNOS capacitors and the Si—H/N—H ratio of the nitride.

Figure 20:
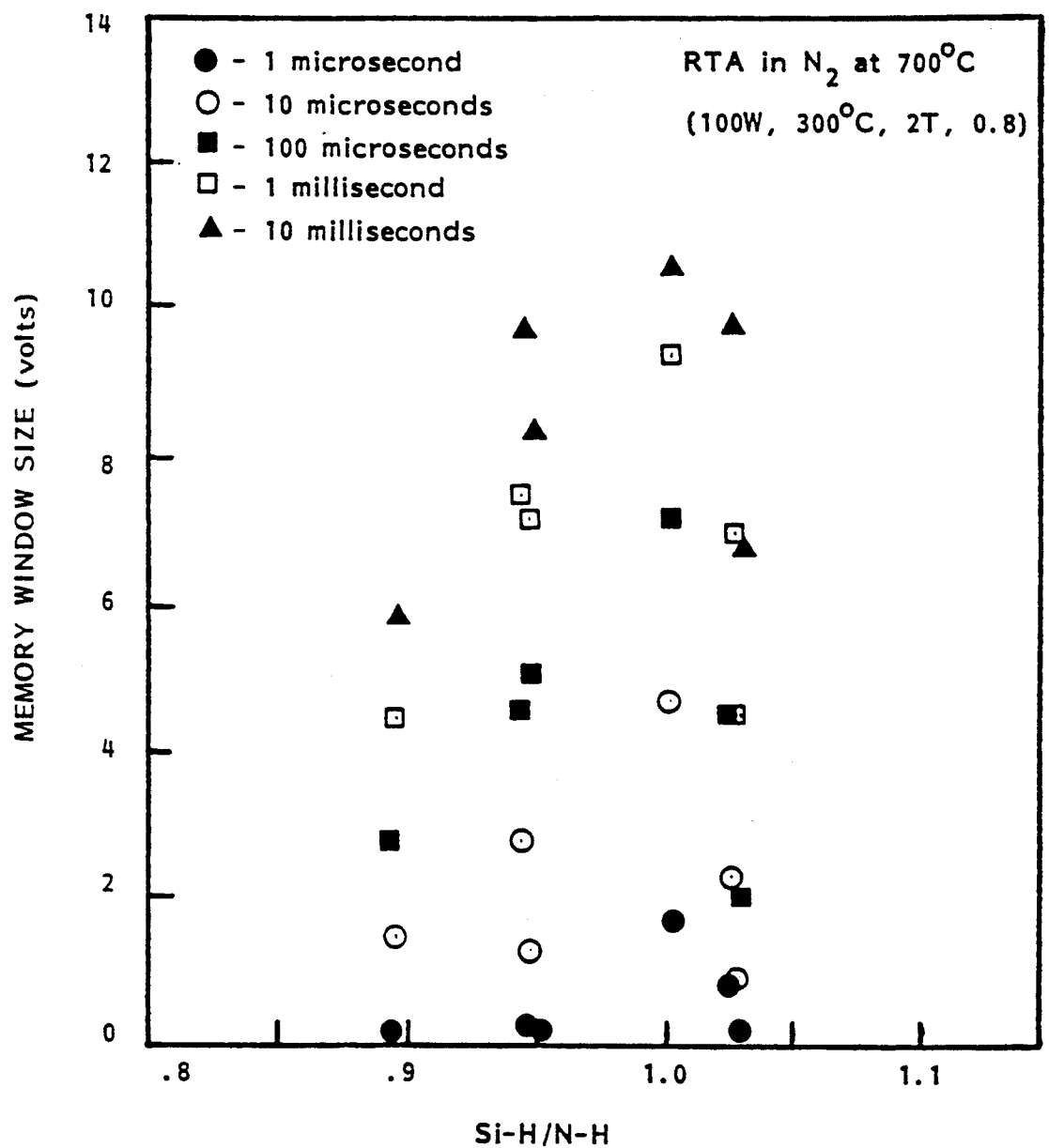
FIG. 20 illustrates a plot of memory window size versus Si—H/N—H ratio for various write/erase pulse widths for devices annealed at 700° C.

FIG. 20 illustrates a plot of memory window size versus Si—H/N—H ratio with write/erase pulse width as a third parameter for devices annealed at 700° C. The largest memory windows were obtained for Si—H/N—H ratios near unity. Films with large Si—H/N—H ratios were highly conductive and generally exhibited very small memory windows because of their reduced ability to retain trapped charge carriers. Small values of Si—H/N—H ratio (i.e., much less than 1.0) were characteristic of films of higher resistivity. As the Si—H/N—H ratio decreases from one, the memory window size decreased until, for sufficiently small ratios (less than 0.75), programming was not possible at any voltage. These results suggest very strongly that the Si—H/N—H ratio of silicon nitride films used in nonvolatile memory devices may be a primary indicator of memory quality and should be considered when determining deposition parameters used to deposit the nitride films for these devices. More importantly, rapid thermal annealing appears to offer a method of stabilizing PECVD silicon nitride thin films for application as the gate dielectric in MOS devices.

Implantation/Annealing

Ion implantation of CVD silicon nitride with nitrogen and helium has been shown in the art to alter its chemical bonding by the transfer of hydrogen from nitrogen to silicon. Also, hydrogen or deuterium implantation, followed by annealing at 500° C., has been known to provide a method for introducing Si—H bonds while minimizing displacement damage. The transfer of hydrogen from nitrogen to silicon is associated with the implantation process and is independent of the implanted ion. The effects on the properties of the silicon nitride include a reduction in high-field transport, an increase in equilibrium positive charge, and increased charge trapping efficiency. Consequently, the memory properties of these films are altered by the implantation process.

In this study, argon was used as the implant species. The film thickness chosen for the initial work was 450 angstroms. However, the tail of the implant penetrated the nitride/silicon interface. Low temperature annealing (at 475° C. for 30 minutes) did not produce recovery of the interface damage and high temperature annealing (at 900° C.) evolved sufficient hydrogen so that the devices failed to exhibit memory properties. Subsequent implantation studies were accomplished using 600 angstroms thick films to avoid this problem.

Figure 21:
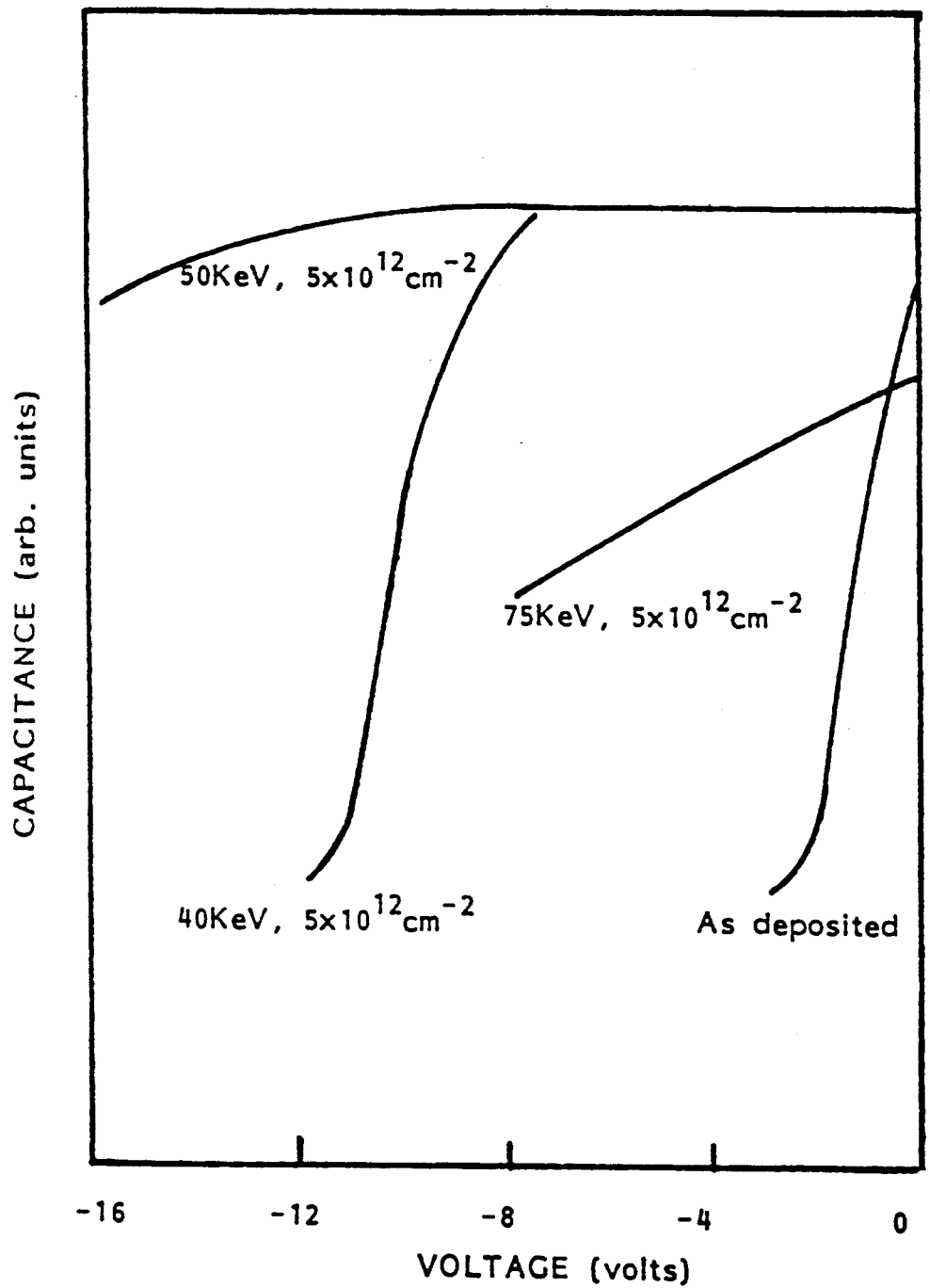
FIG. 21 illustrates a series of C-V curves for devices implanted at different energies with affluence of $5 \times 10^{12}$ ions/cm$^2$ and 5 microampere beam currents.

During the course of this study, a series of implantations were performed which covered a range of implant energies, fluences and beam currents. FIG. 21 illustrates a series of C-V curves for devices implanted at different energies with a fluence of $5 \times 10^{12}$ ions/cm$^2$ and a 5 microampere beam current. The 75 KeV implant penetrated the Si$_3$N$_4$/Si interface and essentially destroyed the device for reasons noted previously. The other two devices showed the characteristic shift toward more negative threshold voltages that accompanied implantation. Annealing at 475° C. for 30 minutes reduced the positive charge accumulated during the implant. Additionally, there was evidence of a slight reduction in interface state density following the implant/anneal.

Figure 22:
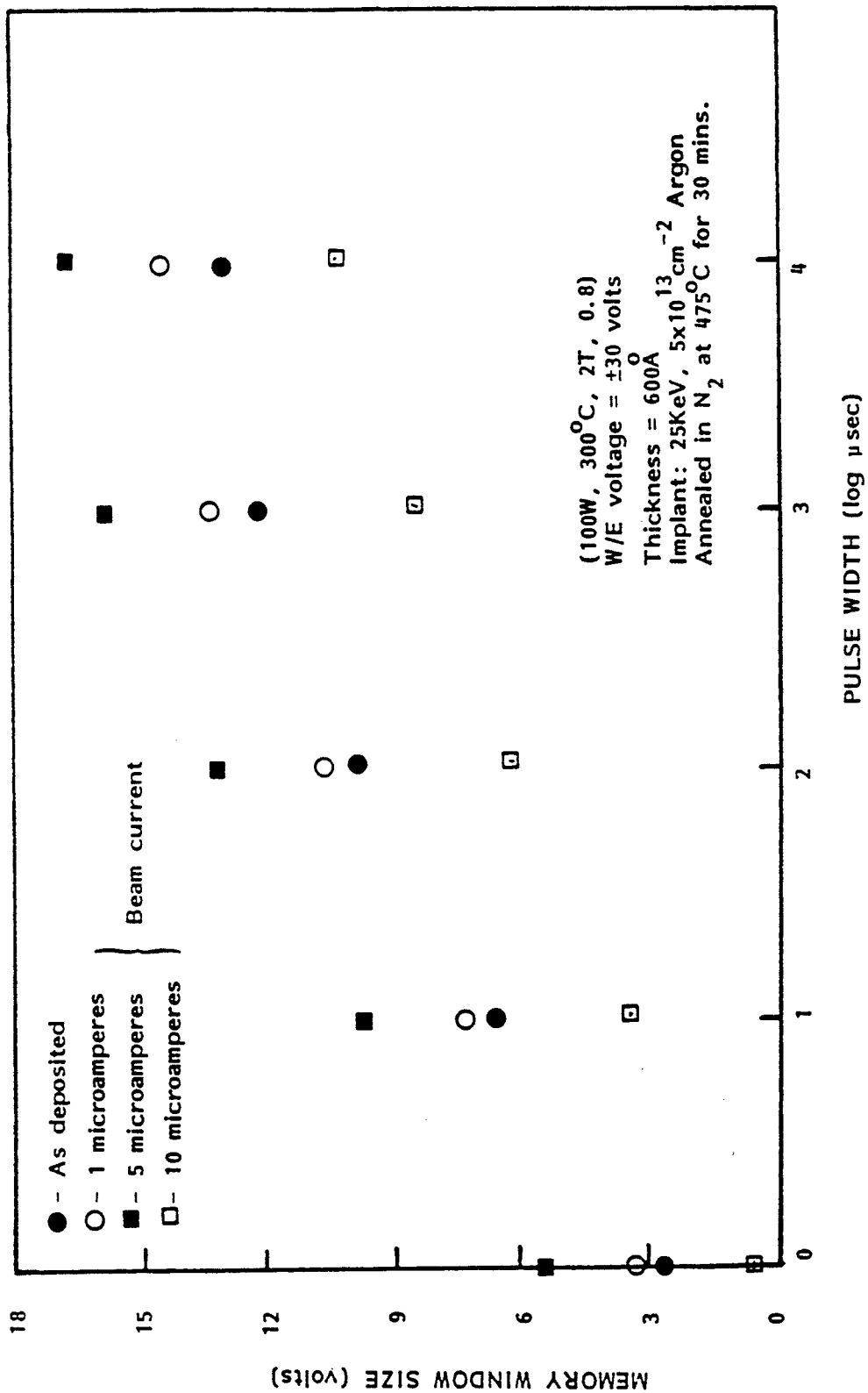
FIG. 22 illustrates beam current effect on memory window size of MNOS capacitors.

FIG. 22 illustrates the effect of beam current on the memory window size of the MNOS capacitors. A 5 microampere beam current produced the largest window size and a significant improvement over "as-deposited" films. Beam currents of 10 microamperes and larger produced extremely large negative shifts in the C-V curves which could not be recovered with the "optimum" 475° C., 30 minute anneal.

Figure 23:
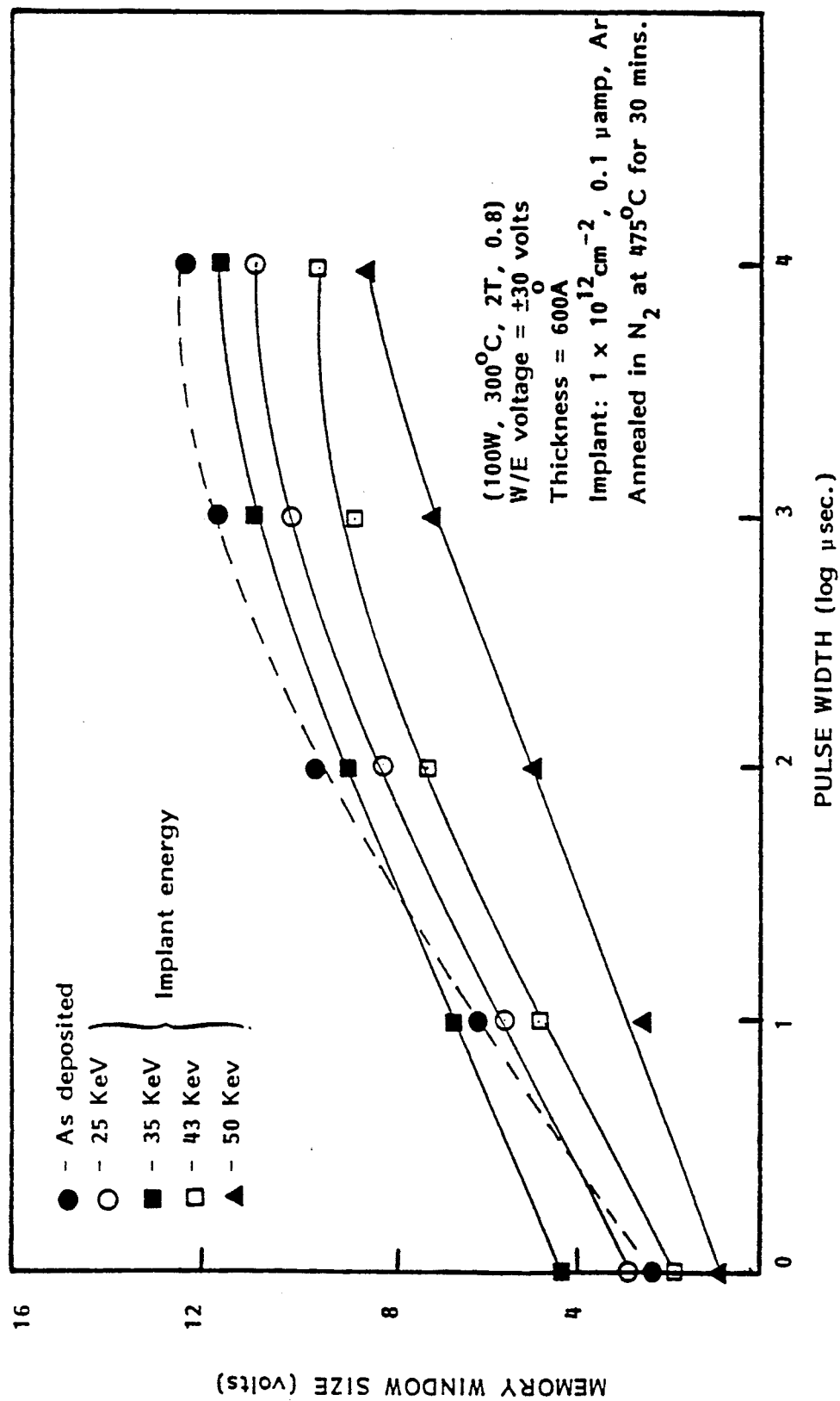
FIG. 23 illustrates beam current effect on memory window size of MNOS capacitors for a 1 microampere beam.
Figure 24:
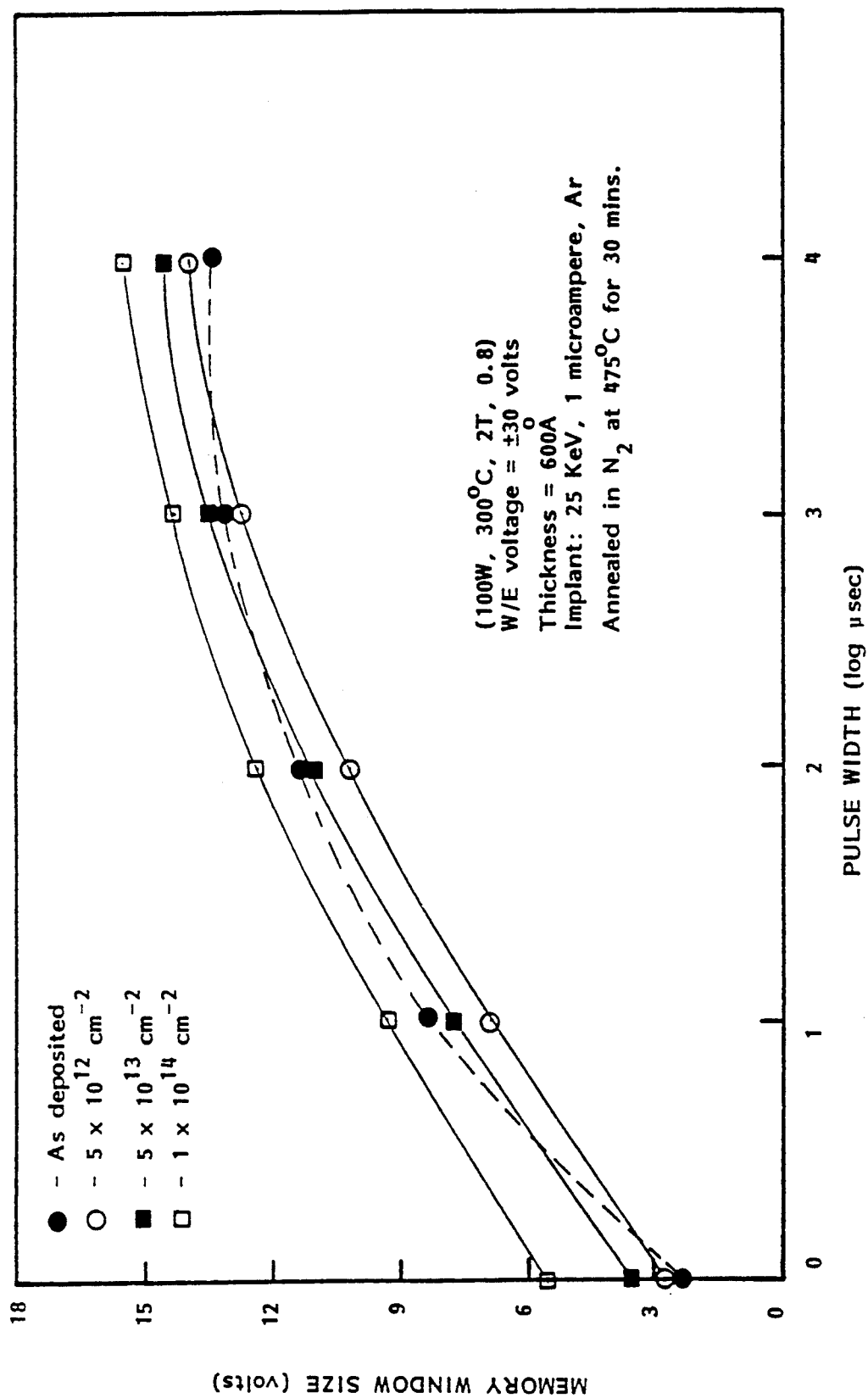
FIG. 24 illustrates variation of memory window size versus pulse width for three different affluences when beam current and energy are held constant at 1 microampere and 25 KeV.

FIG. 23 illustrates a similar plot for a beam current of 1 microampere, a fluence of $1 \times 10^{12}$ ions/cm$^2$ and several implant energies. In this case, the 25 KeV and 35 KeV implant energies enhanced the writing characteristics for short write/erase pulses. FIG. 24 illustrates the variation of memory window size versus pulse width for three different fluences when beam current and energy were held constant at 1 microampere and 25 KeV,, respectively. Altbough the $1 \times 10^{14}$ ions/cm$^2$ fluence produced an improvement over the entire range of pulse widths, the most significant change again occurred for the shorter ones.

It is important to note at this point that the three implant parameters are interdependent. Consequently, modification of the writing characteristics by implantation can be tailored by proper selection of these parameters. However, improvement in memory window size was only obtained for implant energies from 24 to 45 KeV, implant fluences in the range of $10^{12}$ to $10^{14}$ ions/cm$^2$ and beam currents from 0.1 to 5 microamperes.

Figure 25:
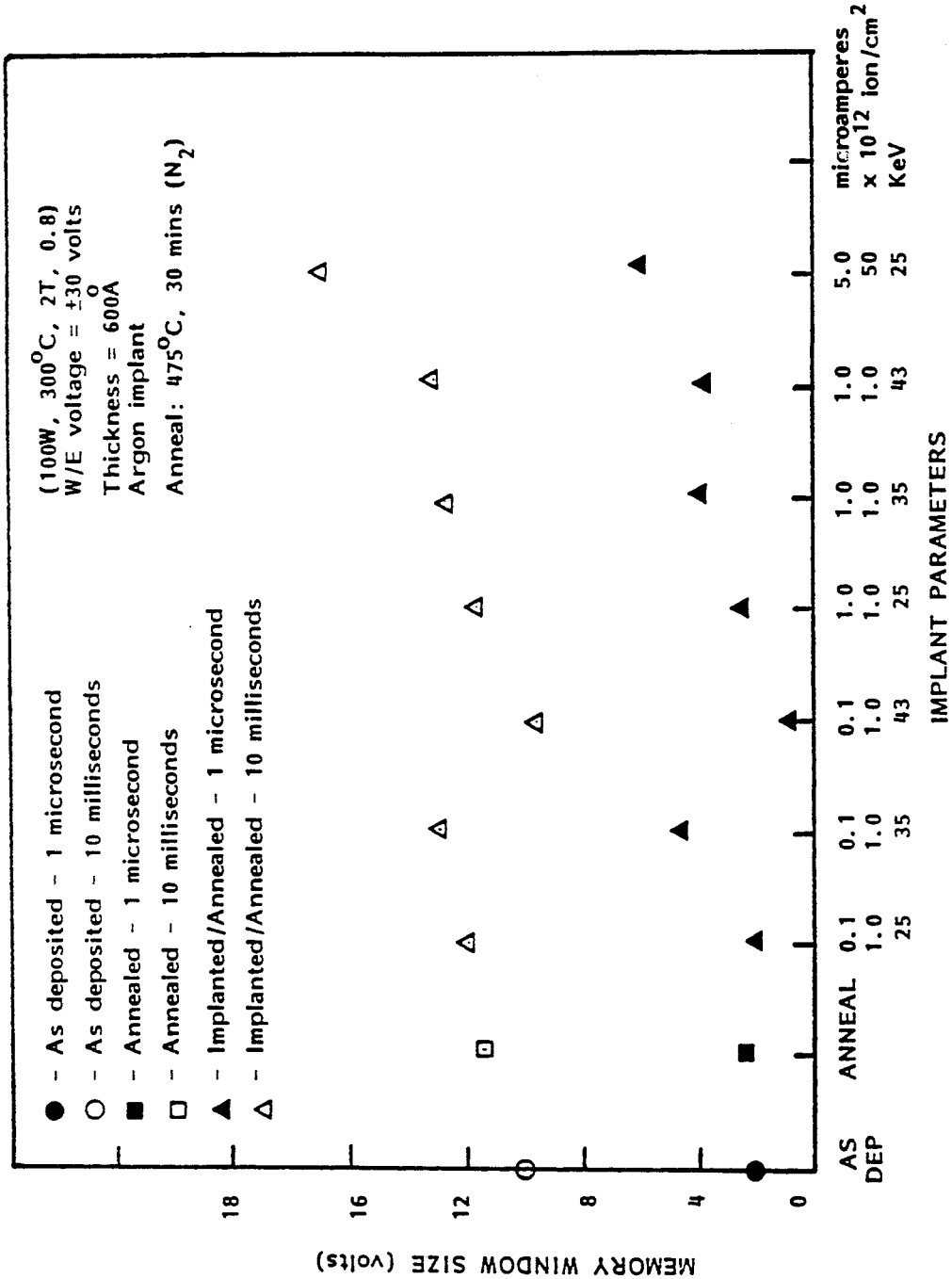
FIG. 25 illustrates memory window size versus several combinations of implant parameters.

FIG. 25 illustrates a plot of memory window size versus several combinations of implant parameters. Data is also provided on "as-deposited" and annealed samples for reference purposes. It is obvious from the data that window size can be altered by the implantation of argon and that the resulting change is a function of the implant energy, fluence and beam current with the largest improvement in window size occurring for a 25 KeV, $5 \times 10^{13}$ ions/cm$^2$, 5 microampere implant.

Figure 26:
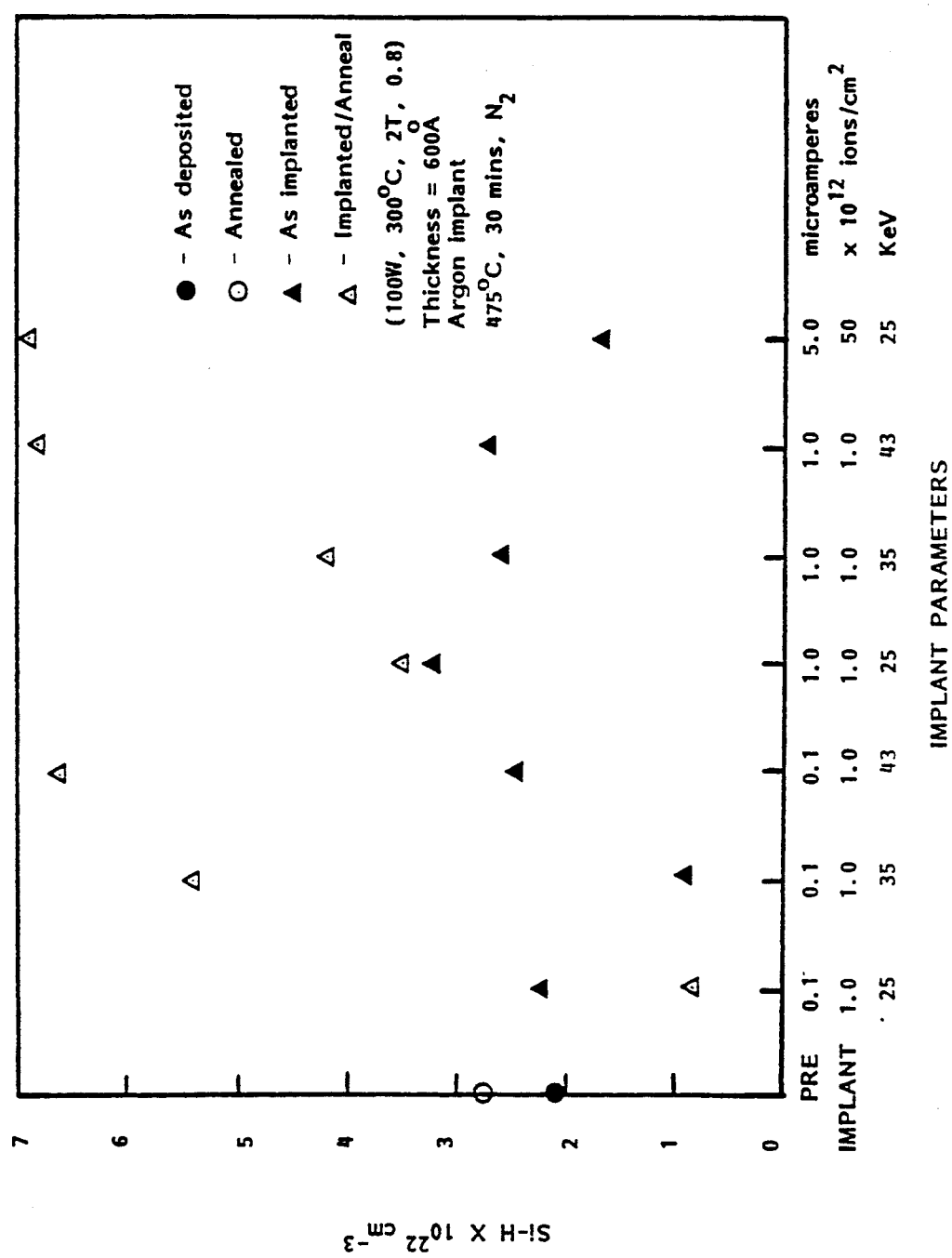
FIG. 26 illustrates Si—H concentration for the implant conditions illustrated in FIG. 25.

FIG. 26 illustrates the Si—H concentration for the corresponding implant conditions of FIG. 25. With one exception (25 KeV, $10^{12}$ ions/cm$^2$, 0.1 microampere), the Si—H bond concentration was increased by the implant/anneal treatment. This occurred by the transfer of hydrogen from nitrogen to silicon. More importantly, the memory window size variation of FIG. 25 correlated with the change in Si—H concentration illustrated in FIG. 26, again suggesting that charge trapping in silicon nitride was associated with the Si—H bond.

From the foregoing, it is apparent that applicants have devised a procedure for producing stable thin films of PECVD silicon nitride which can be applied as the gate dielectric in MOS devices. In summary, the procedure includes the following steps:

(a) depositing a thin film (less than about 1000 angstroms) of silicon nitride on a MOS device substrate by means of plasma enhanced vapor deposition; and (b) subjecting the substrate to rapid thermal annealing at temperatures preferably ranging from about 6000° C. to about 700° C. at times preferably ranging from about 3 seconds to about 30 seconds.

While a preferred embodiment has been shown, modifications and changes may become apparent to those skilled in the art which shall fall within the spirit and scope of the invention. It is intended that such modifications and changes be covered by the attached claims.

We claim as our invention:

1. A device comprising:
   (a) a thin film layer of silicon nitride having a thickness of less than about 1000Å on a substrate deposited by means of plasma enhanced chemical vapor deposition techniques; and
   (b) the silicon nitride layer having been rapidly thermal annealed within a temperature range and a time period range sufficient to increase the N—H bond concentration of the silicon nitride to produce a thin film layer of silicon nitride that is less than about 1000Å thick and stable with respect to change transfer hysteresis between the silicon nitride and the substrate.

2. The device of claim 1, wherein the substrate is silicon.

3. The device of claim 1, wherein the temperature range is from about 600° C. to about 700° C.

4. The device of claim 1, wherein the time period range is from about 3 seconds to about 30 seconds.

5. The device of claim 1, wherein the annealing takes place in a nitrogen atmosphere.

* * * * *

UNITED STATES PATENT AND TRADEMARK OFFICE
CERTIFICATE OF CORRECTION

PATENT NO. : 5,264,724
DATED : November 23, 1993
INVENTOR(S) : William D. Brown, et al It is certified that error appears in the above-indentified patent and that said Letters Patent is hereby corrected as shown below:

Column 1, line 40, "bysteresis" should be --hysteresis--

Column 2, line 68, "bas" should be --has--

Column 4, line 3, insert a space between "$cm^2$" and "and"

Column 4, line 45, "dioxizedwater" should be --dioxized water--

Column 4, line 54, "1 mm" should be --1mm--

Column 5, line 30, "400°0C" should be --400°C--

Column 5, line 38, "$4cm^{3[\ ]}$" should be --$4cm^{-1}$--

Column 6, line 11, "4000° C" should be --400°C--

Column 6, line 29, "37  As-deposited" should be --"As-deposited--

Column 8, line 44, "50°0 C and/or 100°0 C" should be --50°C and/or 100°C--

Column 8, line 56, "500°0 C" should be --500°C--

Column 9, line 23, "4750° C" should be --475°C--

Column 12, line 17, "6000° C" should be --600°C--

Signed and Sealed this

Twenty-seventh Day of June, 1995

Attest:

BRUCE LEHMAN

*Attesting Officer*    *Commissioner of Patents and Trademarks*